US009042565B2

(12) United States Patent
Jot et al.

(10) Patent No.: US 9,042,565 B2
(45) Date of Patent: May 26, 2015

(54) SPATIAL AUDIO ENCODING AND REPRODUCTION OF DIFFUSE SOUND

(75) Inventors: Jean-Marc Jot, Aptos, CA (US); Stephen Roger Hastings, Kirkland, WA (US); James D. Johnston, Redmond, WA (US)

(73) Assignee: DTS, Inc., Calabasas, CA (US)

( * ) Notice: Subject to any disclaimer, the term of this patent is extended or adjusted under 35 U.S.C. 154(b) by 671 days.

(21) Appl. No.: 13/228,336

(22) Filed: Sep. 8, 2011

(65) Prior Publication Data

US 2012/0082319 A1 Apr. 5, 2012

Related U.S. Application Data

(60) Provisional application No. 61/380,975, filed on Sep. 8, 2010.

(51) Int. Cl.

| | |
|---|---|
| ***G10L 19/008*** | (2013.01) |
| ***G10K 15/12*** | (2006.01) |
| ***H04S 7/00*** | (2006.01) |
| ***H03G 3/00*** | (2006.01) |

(52) U.S. Cl.

CPC ................. *G10L 19/008* (2013.01); *H04S 7/30* (2013.01); *H04S 2400/15* (2013.01); *G10K 15/12* (2013.01); *H04S 2420/03* (2013.01)

(58) Field of Classification Search

CPC ............ H04R 5/04; H04R 5/033; H04S 7/30; H04S 2400/11; H04S 2400/03; H04S 1/007; H04S 3/00; G10L 21/0202; G10L 19/008

USPC .................. 381/63, 61, 22, 23; 704/500, 501, 704/E19.001, E21.001; 700/94; 84/630, 84/707

See application file for complete search history.

(56) References Cited

U.S. PATENT DOCUMENTS

| | | | | |
|---|---|---|---|---|
| 7,583,805 | B2 | 9/2009 | Baumgarte et al. | |
| 8,300,841 | B2 * | 10/2012 | Lindahl et al. | 381/61 |
| 8,345,887 | B1 | 1/2013 | Betbeder | |
| 8,351,614 | B2 * | 1/2013 | Wu et al. | 381/63 |
| 8,488,796 | B2 | 7/2013 | Jot et al. | |
| 2003/0007648 | A1 * | 1/2003 | Currell | 381/61 |
| 2008/0281602 | A1 * | 11/2008 | Van Schijndel et al. | 704/500 |
| 2008/0310640 | A1 | 12/2008 | Oh et al. | |
| 2009/0060236 | A1 | 3/2009 | Johnston et al. | |
| 2009/0225993 | A1 | 9/2009 | Cvetkovic | |

(Continued)

OTHER PUBLICATIONS

International Search Report in corresponding PCT Application No. PCT/US2011/050885.

(Continued)

*Primary Examiner* — Vivian Chin
*Assistant Examiner* — David Ton
(74) *Attorney, Agent, or Firm* — Blake Welcher; William Johnson; Craig Fischer

(57) ABSTRACT

A method and apparatus processes multi-channel audio by encoding, transmitting or recording "dry" audio tracks or "stems" in synchronous relationship with time-variable metadata controlled by a content producer and representing a desired degree and quality of diffusion. Audio tracks are compressed and transmitted in connection with synchronized metadata representing diffusion and preferably also mix and delay parameters. The separation of audio stems from diffusion metadata facilitates the customization of playback at the receiver, taking into account the characteristics of local playback environment.

8 Claims, 10 Drawing Sheets

(56) References Cited

U.S. PATENT DOCUMENTS

| | | | | |
|---|---|---|---|---|
| 2011/0060599 | A1 * | 3/2011 | Kim et al. | 704/501 |
| 2012/0057715 | A1 | 3/2012 | Johnston et al. | |
| 2013/0044883 | A1 | 2/2013 | Lindahl et al. | |

OTHER PUBLICATIONS

Extended European Search Report in corresponding European Patent Application No. 11824148.8-1951, filed Sep. 8, 2011.

United States Patent and Trademark Office Office Action, dated Apr. 9, 2014, in corresponding U.S. Appl. No. 13/021,922, filed Apr. 9, 2014.

EPO Extended Search Report, dated Apr. 10, 2014, based on PCT/US2011/050885, filed Sep. 8, 2011.

Taejin Lee, et al.: "An Object-based 3D Audio Broadcasting System for Interactive Service", Audio Engineering Society Convention Paper, New York, NY, US, Convention Paper No. 6384, May 28, 2005, pp. 1-8, XP002577516, retrieved from the Internet: URL:http://www.aes.org/tempFiles/elib/20100413/13100.pdf (the whole document).

V. Pulkki, et al.: "Directional audio coding—perception-based reproduction of spatial sound", International Workshop on the Principles and Applications of Spatial Hearing, Nov. 11, 2009, XP055083986, Zao, Miyagi, Japan, retrieved from the Internet: URL:http://www.mediatech.aalto.fi/~ktlokki/Publs/pulkki_iwpash.pdf (the whole document).

Huopaniemi, J., et al.: "Advanced AudioBIFS: Virtual Acoustics Modeling in MPEG-4 Scene Description", IEEE Transactions on Multimedia, IEEE Service Center, Piscataway, NJ, US, vol. 6, No. 5, Oct. 1, 2004, pp. 661-675, XP011118809, ISSN: 1520-9210, DOI: 10.1109/TMM.2004.834864 (the whole document).

Schroeder, M.R.: "Natural Sounding Artificial Reverberation", Journal of the Audio Engineering Society, vol. 10, Jul. 1, 1962, pp. 1-5, XP001418938 (the whole document).

* cited by examiner

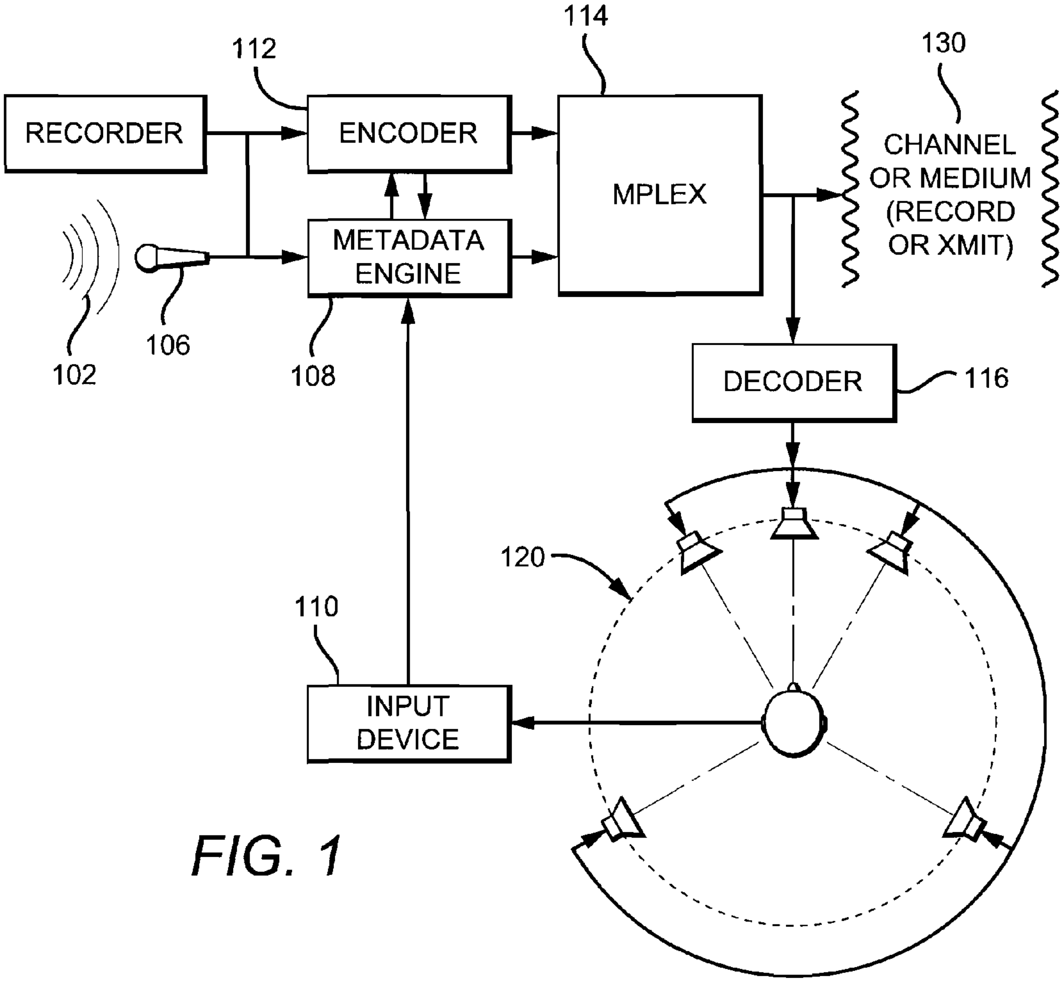
FIG. 1
FIG. 2
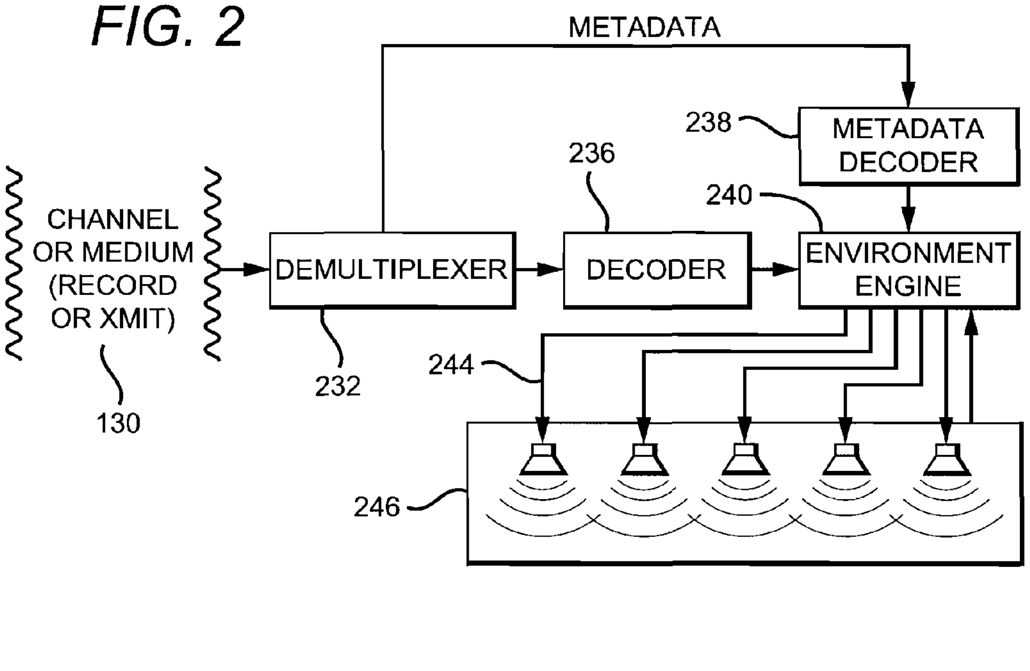

FIG. 6
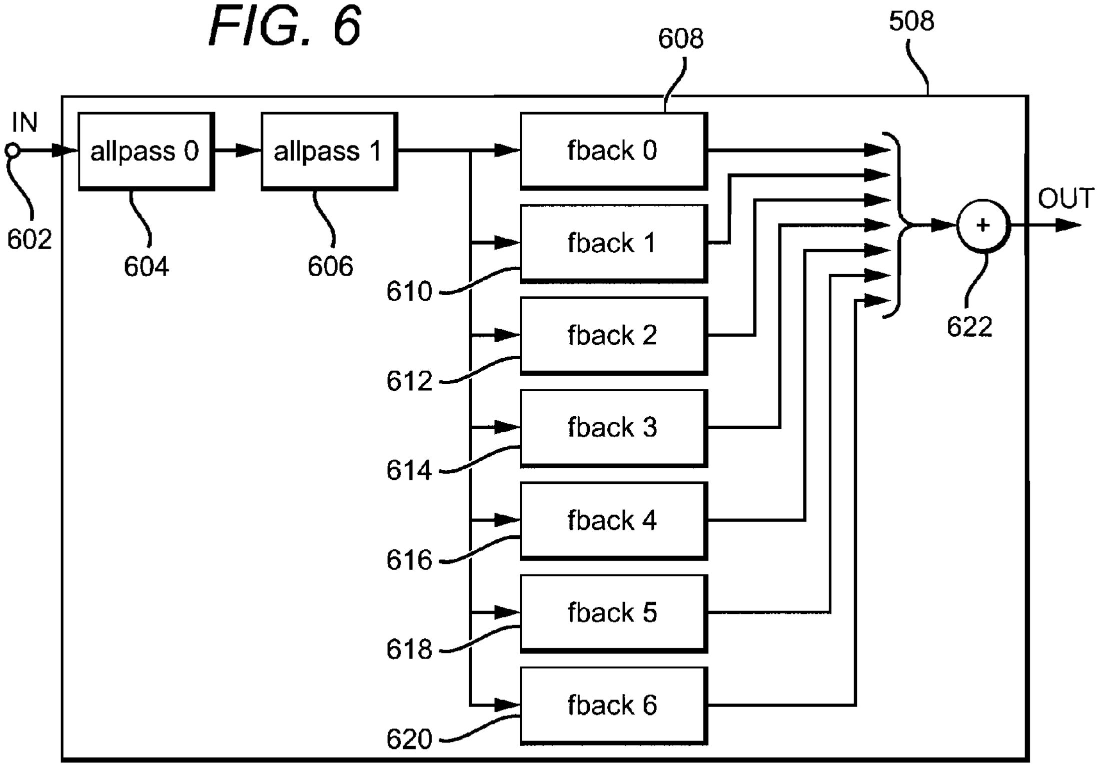
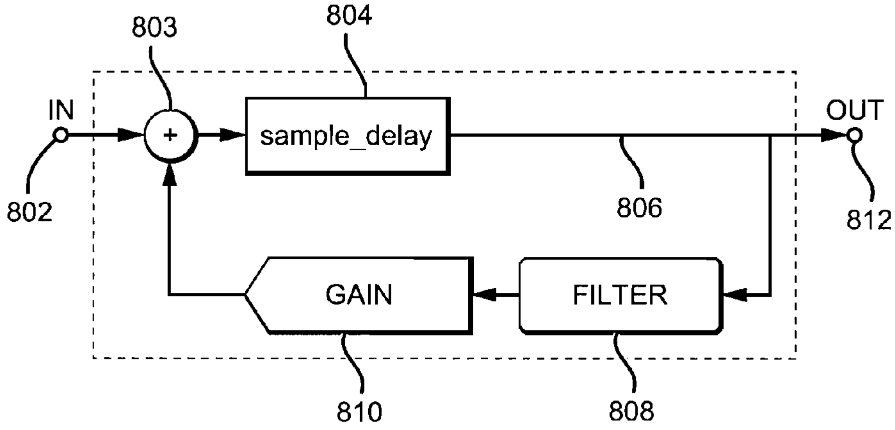
FIG. 8

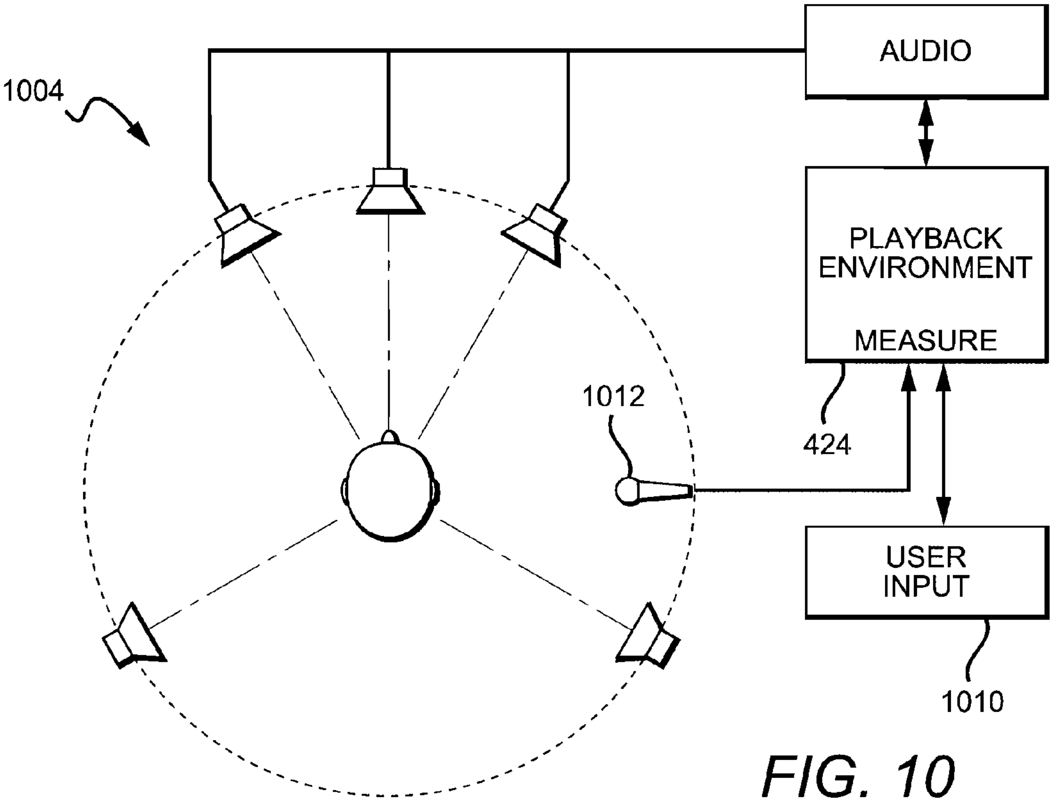
FIG. 10
FIG. 11
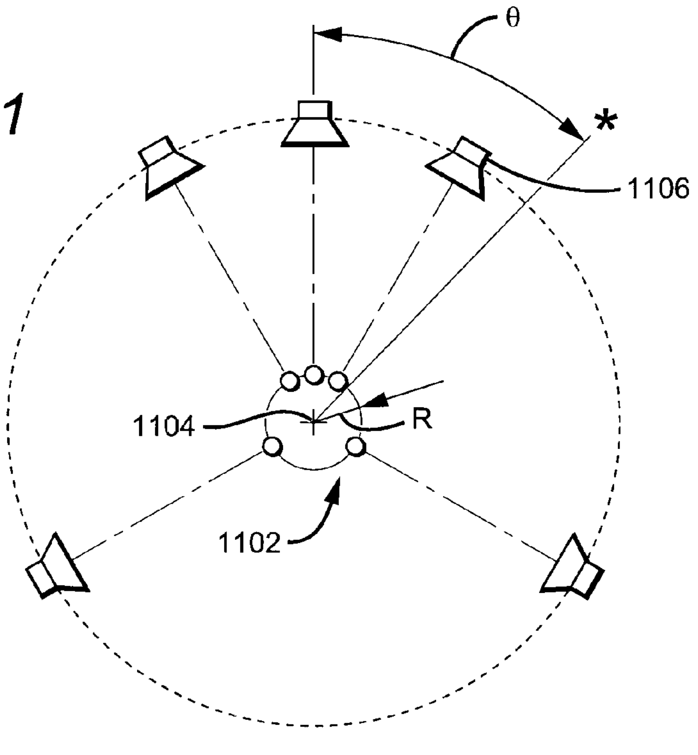

SPATIAL AUDIO ENCODING AND REPRODUCTION OF DIFFUSE SOUND

CROSS-REFERENCE

This application claims priority of U.S. Provisional Application No. 61/380,975, filed on 8 Sep. 2010.

BACKGROUND OF THE INVENTION

1. Field of the Invention

This invention relates to high-fidelity audio reproduction generally, and more specifically to the origination, transmission, recording, and reproduction of digital audio, especially encoded or compressed multi-channel audio signals.

2. Description of the Related Art

Digital audio recording, transmission, and reproduction has exploited a number of media, such as standard definition DVD, high definition optical media (for example "Blu-ray discs") or magnetic storage (hard disk) to record or transmit audio and/or video information to the listener. More ephemeral transmission channels such as radio, microwave, fiber optics, or cabled networks are also used to transmit and receive digital audio. The increasing bandwidth available for audio and video transmission has led to the widespread adoption of various multi-channel, compressed audio formats. One such popular format is described in U.S. Pat. Nos. 5,974,380, 5,978,762, and 6,487,535 assigned to DTS, Inc. (widely available under the trademark, "DTS" surround sound).

Much of the audio content distributed to consumers for home viewing corresponds to theatrically released cinema features. The soundtracks are typically mixed with a view toward cinema presentation, in sizable theater environments. Such a soundtrack typically assumes that the listeners (seated in a theater) may be close to one or more speakers, but far from others. The dialog is typically restricted to the center front channel. Left/right and surround imaging are constrained both by the assumed seating arrangements and by the size of the theater. In short, the theatrical soundtrack consists of a mix that is best suited to reproduction in a large theater.

On the other hand, the home-listener is typically seated in a small room with higher quality surround sound speakers arranged to better permit a convincing spatial sonic image. The home theater is small, with a short reverberation time. While it is possible to release different mixes for home and for cinema listening, this is rarely done (possibly for economic reasons). For legacy content, it is typically not possible because original multi-track "stems" (original, unmixed sound files) may not be available (or because the rights are difficult to obtain). The sound engineer who mixes with a view toward both large and small rooms must necessarily make compromises. The introduction of reverberant or diffuse sound into a soundtrack is particularly problematic due to the differences in the reverberation characteristics of the various playback spaces.

This situation yields a less than optimal acoustic experience for the home-theater listener, even the listener who has invested in an expensive, surround-sound system.

Baumgarte et al., in U.S. Pat. No. 7,583,805, propose a system for stereo and multi-channel synthesis of audio signals based on inter-channel correlation cues for parametric coding. Their system generates diffuse sound which is derived from a transmitted combined (sum) signal. Their system is apparently intended for low bit-rate applications such as teleconferencing. The aforementioned patent discloses use of time-to-frequency transform techniques, filters, and reverberation to generate simulated diffuse signals in a frequency domain representation. The disclosed techniques do not give the mixing engineer artistic control, and are suitable to synthesize only a limited range of simulated reverberant signals, based on the interchannel coherence measured during recording. The "diffuse" signals disclosed are based on analytic measurements of an audio signal rather than the appropriate kind of "diffusion" or "decorrelation" that the human ear will resolve naturally. The reverberation techniques disclosed in Baumgarte's patent are also rather computationally demanding and are therefore inefficient in more practical implementations.

SUMMARY OF THE INVENTION

In accordance with the present invention, there are provided multiple embodiments for conditioning multi-channel audio by encoding, transmitting or recording "dry" audio tracks or "stems" in synchronous relationship with time-variable metadata controlled by a content producer and representing a desired degree and quality of diffusion. Audio tracks are compressed and transmitted in connection with synchronized metadata representing diffusion and preferably also mix and delay parameters. The separation of audio stems from diffusion metadata facilitates the customization of playback at the receiver, taking into account the characteristics of the local playback environment.

In a first aspect of the present invention, there is provided a method for conditioning an encoded digital audio signal, said audio signal representative of a sound. The method includes receiving encoded metadata that parametrically represents a desired rendering of said audio signal data in a listening environment. The metadata includes at least one parameter capable of being decoded to configure a perceptually diffuse audio effect in at least one audio channel. The method includes processing said digital audio signal with said perceptually diffuse audio effect configured in response to said parameter, to produce a processed digital audio signal.

In another embodiment, there is provided a method for conditioning a digital audio input signal for transmission or recording. The method includes compressing said digital audio input signal to produce an encoded digital audio signal. The method continues by generating a set of metadata in response to user input, said set of metadata representing a user selectable diffusion characteristic to be applied to at least one channel of said digital audio signal to produce a desired playback signal. The method finishes by multiplexing said encoded digital audio signal and said set of metadata in synchronous relationship to produce a combined encoded signal.

In an alternative embodiment, there is provided a method for encoding and reproducing a digitized audio signal for reproduction. The method includes encoding the digitized audio signal to produce an encoded audio signal. The method continues by being responsive to user input and encoding a set of time-variable rendering parameters in a synchronous relationship with said encoded audio signal. The rendering parameters represent a user choice of a variable perceptual diffusion effect.

In a second aspect of the present invention, there is provided a recorded data storage medium, recorded with digitally represented audio data. The recorded data storage medium comprises compressed audio data representing a multichannel audio signal, formatted into data frames; and a set of user selected, time-variable rendering parameters, formatted to convey a synchronous relationship with said compressed audio data. The rendering parameters represent a user choice of a time-variable diffusion effect to be applied to modify said multichannel audio signal upon playback.

In another embodiment, there is provided a configurable audio diffusion processor for conditioning a digital audio signal, comprising a parameter decoding module, arranged to receive rendering parameters in synchronous relationship with said digital audio signal. In a preferred embodiment of the diffusion processor, a configurable reverberator module is arranged to receive said digital audio signal and responsive to control from said parameter decoding module. The reverberator module is dynamically reconfigurable to vary a time decay constant in response to control from said parameter decoding module.

In a third aspect of the present invention, there is provided a method of receiving an encoded audio signal and producing a replica decoded audio signal. The encoded audio signal includes audio data representing a multichannel audio signal and a set of user selected, time-variable rendering parameters, formatted to convey a synchronous relationship with said audio data. The method includes receiving said encoded audio signal and said rendering parameters. The method continues by decoding said encoded audio signal to produce a replica audio signal. The method includes configuring an audio diffusion processor in response to said rendering parameters. The method finishes by processing said replica audio signal with said audio diffusion processor to produce a perceptually diffuse replica audio signal.

In another embodiment, there is provided a method of reproducing multi-channel audio sound from a multi-channel digital audio signal. The method includes reproducing a first channel of said multi-channel audio signal in a perceptually diffuse manner. The method finishes by reproducing at least one further channel in a perceptually direct manner. The first channel may be conditioned with a perceptually diffuse effect by digital signal processing before reproduction. The first channel may be conditioned by introducing frequency dependent delays varying in a manner sufficiently complex to produce the psychoacoustic effect of diffusing an apparent sound source.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1 is a system level schematic diagram of the encoder aspect of the invention, with functional modules symbolically represented by blocks (a "block diagram");

FIG. 2 is a system level schematic diagram of the decoder aspect of the invention, with functional modules symbolically represented;

FIG. 6 is a schematic diagram of a reverberator module included in FIG. 5, with functional modules symbolically represented;

FIG. 8 is a schematic diagram of a feedback comb filter suitable for implementing a submodule of the reverberator module in FIG. 6, with functional modules symbolically represented;

FIG. 10 is a schematic diagram of a playback environment engine, in relation to a playback environment, suitable for use in the decoder aspect of the invention;

FIG. 11 is a diagram, with some components represented symbolically, depicting a "virtual microphone array" useful for calculating gain and delay matrices for use in the diffusion engine of FIG. 5;

DETAILED DESCRIPTION OF THE INVENTION

Introduction

Figure 3:
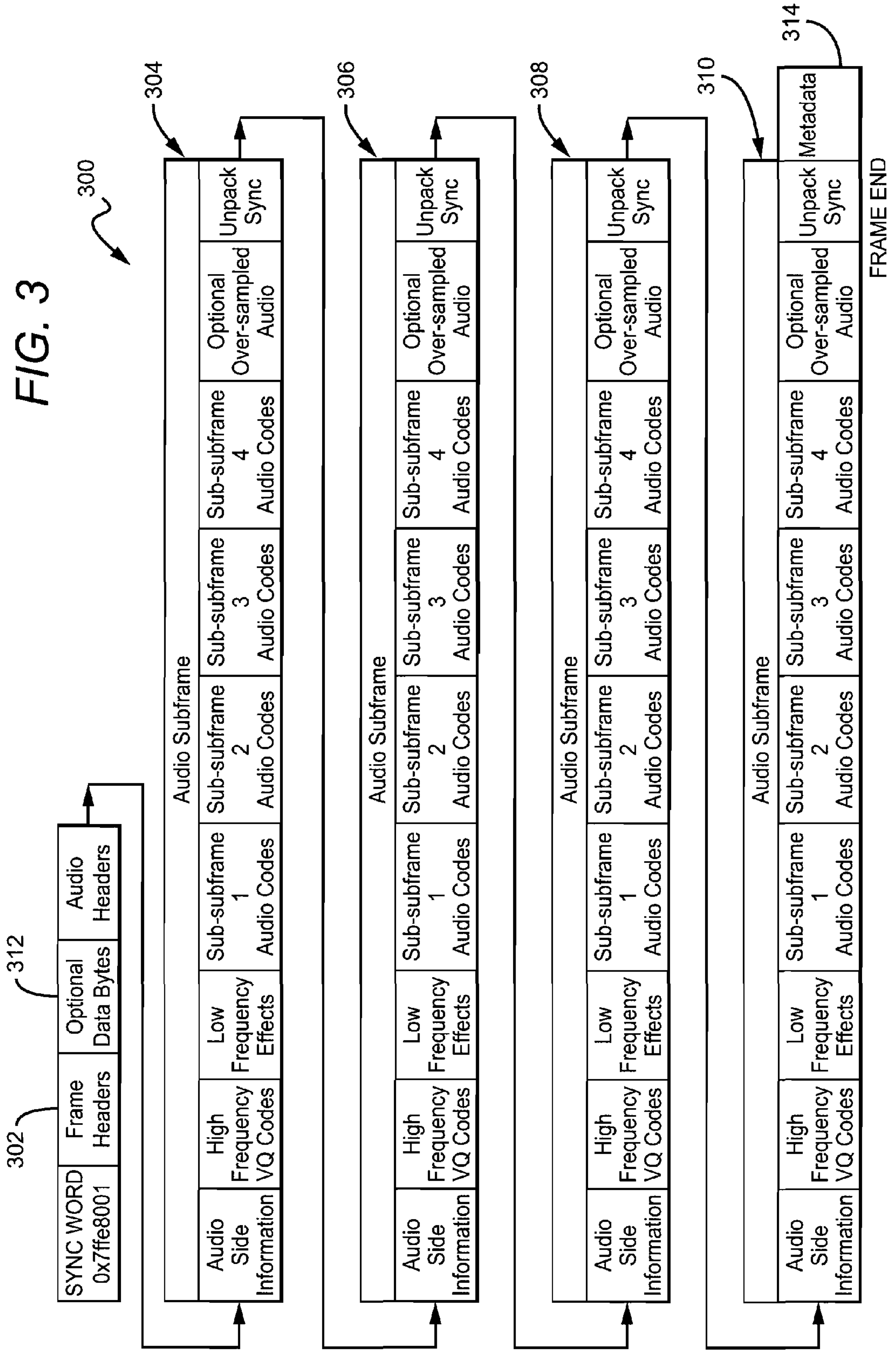
FIG. 3 is a representation of a data format suitable for packing audio, control, and metadata for use by the invention.

The invention concerns processing of audio signals, which is to say signals representing physical sound. These signals are represented by digital electronic signals. In the discussion which follows, analog waveforms may be shown or discussed to illustrate the concepts; however, it should be understood that typical embodiments of the invention will operate in the context of a time series of digital bytes or words, said bytes or words forming a discrete approximation of an analog signal or (ultimately) a physical sound. The discrete, digital signal corresponds to a digital representation of a periodically sampled audio waveform. As is known in the art, the waveform must be sampled at a rate at least sufficient to satisfy the Nyquist sampling theorem for the frequencies of interest. For example, in a typical embodiment a sampling rate of approximately 44.1 thousand samples/second may be used. Higher, oversampling rates such as 96 khz may alternatively be used. The quantization scheme and bit resolution should be chosen to satisfy the requirements of a particular application, according to principles well known in the art. The techniques and apparatus of the invention typically would be applied interdependently in a number of channels. For example, it could be used in the context of a "surround" audio system (having more than two channels).

As used herein, a "digital audio signal" or "audio signal" does not describe a mere mathematical abstraction, but instead denotes information embodied in or carried by a physical medium capable of detection by a machine or apparatus. This term includes recorded or transmitted signals, and should be understood to include conveyance by any form of encoding, including pulse code modulation (PCM), but not limited to PCM. Outputs or inputs, or indeed intermediate audio signals could be encoded or compressed by any of various known methods, including MPEG, ATRAC, AC3, or the proprietary methods of DTS, Inc. as described in U.S. Pat. Nos. 5,974,380; 5,978,762; and 6,487,535. Some modification of the calculations may be required to accommodate that particular compression or encoding method, as will be apparent to those with skill in the art.

In this specification the word "engine" is frequently used: for example, we refer to a "production engine," an "environment engine" and a "mixing engine." This terminology refers to any programmable or otherwise configured set of electronic logical and/or arithmetic signal processing modules that are programmed or configured to perform the specific functions described. For example, the "environment engine" is, in one embodiment of the invention, a programmable microprocessor controlled by a program module to execute the functions attributed to that "environment engine." Alternatively, field programmable gate arrays (FPGAs), programmable Digital signal processors (DSPs), specialized application specific integrated circuits (ASICs), or other equivalent circuits could be employed in the realization of any of the "engines" or subprocesses, without departing from the scope of the invention.

Those with skill in the art will also recognize that a suitable embodiment of the invention might require only one microprocessor (although parallel processing with multiple processors would improve performance). Accordingly, the various modules shown in the figures and discussed herein can be understood to represent procedures or a series of actions when considered in the context of a processor based implementation. It is known in the art of digital signal processing to carry out mixing, filtering, and the other operations by operating sequentially on strings of audio data. Accordingly, one with skill in the art will recognize how to implement the various modules by programming in a symbolic language such as C or C++, which can then be implemented on a specific processor platform.

The system and method of the invention permit the producer and sound engineer to create a single mix that will play well in the cinema and in the home. Additional, this method may be used to produce a backward-compatible cinema mix in a standard format such as the DTS 5.1 "digital surround" format (referenced above). The system of the invention differentiates between sounds that the Human Auditory System (HAS) will detect as direct, which is to say arriving from a direction, corresponding to a perceived source of sound, and those that are diffuse, which is to say sounds that are "around" or "surrounding" or "enveloping" the listener. It is important to understand that one can create a sound that is diffuse only on, for instance, one side or direction of the listener. The difference in that case between direct and diffuse is the ability to localize a source direction vs. the ability to localize a substantial region of space from which the sound arrives.

A direct sound, in terms of the human audio system, is a sound that arrives at both ears with some inter-aural time delay (ITD) and inter-aural level difference (ILD) (both of which are functions of frequency), with the ITD and ILD both indicating a consistent direction, over a range of frequencies in several critical bands (as explained in "The Psychology of Hearing" by Brian C. J. Moore). A diffuse signal, conversely, will have the ITD and ILD "scrambled" in that there will be little consistency across frequency or time in the ITD and ILD, a situation that corresponds, for instance, to a sense of reverberation that is around, as opposed to arriving from a single direction. As used in the context of the invention a "diffuse sound" refers to a sound that has been processed or influenced by acoustic interaction such that at least one, and most preferably both of the following conditions occur: 1) the leading edges of the waveform (at low frequencies) and the waveform envelope at high frequencies, do not arrive at the same time in an ear at various frequencies; and 2) the inter-aural time difference (ITD) between two ears varies substantially with frequency. A "diffuse signal" or a "perceptually diffuse signal" in the context of the invention refers to a (usually multichannel) audio signal that has been processed electronically or digitally to create the effect of a diffuse sound when reproduced to a listener.

In a perceptually diffuse sound, the time variation in time of arrival and the ITD exhibit complex and irregular variation with frequency, sufficient to cause the psychoacoustic effect of diffusing a sound source.

In accordance with the invention, diffuse signals are preferably produced by using a simple reverberation method described below (preferably in combination with a mixing process, also described below). There are other ways to create diffuse sounds, either by signal processing alone or by signal processing and time-of-arrival at the two ears from a multi-radiator speaker system, for example either a "diffuse speaker" or a set of speakers.

The concept of "diffuse" as used herein is not to be confused with chemical diffusion, with decorrelation methods that do not produce the psychoacoustic effects enumerated above, or any other unrelated use of the word "diffuse" that occurs in other arts and sciences.

As used herein, "transmitting" or "transmitting through a channel" mean any method of transporting, storing, or recording data for playback which might occur at a different time or place, including but not limited to electronic transmission, optical transmission, satellite relay, wired or wireless communication, transmission over a data network such as the internet or LAN or WAN, recording on durable media such as magnetic, optical, or other form (including DVD, "Blu-ray" disc, or the like). In this regard, recording for either transport, archiving, or intermediate storage may be considered an instance of transmission through a channel.

As used herein, "synchronous" or "in synchronous relationship" means any method of structuring data or signals that preserves or implies a temporal relationship between signals or subsignals. More specifically, a synchronous relationship between audio data and metadata means any method that preserves or implies a defined temporal synchrony between the metadata and the audio data, both of which are time-varying or variable signals. Some exemplary methods of synchronizing include time domain multiplexing (TDMA), interleaving, frequency domain multiplexing, time-stamped packets, multiple indixed synchronizable data sub-streams, synchronous or asynchronous protocols, IP or PPP protocols, protocols defined by the Blu-ray disc association or DVD standards, MP3, or other defined formats.

As used herein, "receiving" or "receiver" shall mean any method of receiving, reading, decoding, or retrieving data from a transmitted signal or from a storage medium.

As used herein, a "demultiplexer" or "unpacker" means an apparatus or a method, for example an executable computer program module that is capable of use to unpack, demultiplex, or separate an audio signal from other encoded metadata such as rendering parameters. It should be borne in mind that data structures may include other header data and metadata in addition to the audio signal data and the metadata used in the invention to represent rendering parameters.

As used herein, "rendering parameters" denotes a set of parameters that symbolically or by summary convey a manner in which recorded or transmitted sound is intended to be modified upon receipt and before playback. The term specifically includes a set of parameters representing a user choice of magnitude and quality of one or more time-variable reverberation effects to be applied at a receiver, to modify said multichannel audio signal upon playback. In a preferred embodiment, the term also includes other parameters, as for example a set of mixing coefficients to control mixing of a set of multiple audio channels. As used herein, "receiver" or "receiver/decoder" refers broadly to any device capable of receiving, decoding, or reproducing a digital audio signal however transmitted or recorded. It is not limited to any limited sense, as for example an audio-video receiver.

System Overview:

FIG. 1 shows a system-level overview of a system for encoding, transmitting, and reproducing audio in accordance with the invention. Subject sounds 102 emanate in an acoustic environment 104, and are converted into digital audio signals by multi-channel microphone apparatus 106. It will be understood that some arrangement of microphones, analog to digital converters, amplifiers, and encoding apparatus can be used in known configurations to produce digitized audio. Alternatively, or in addition to live audio, analog or digitally recorded audio data ("tracks") can supply the input audio data, as symbolized by recording device 107.

In the preferred mode of using the invention, the audio sources (either live or recorded) that are to be manipulated should be captured in a substantially "dry" form: in other words, in a relatively non-reverberant environment, or as a direct sound without significant echoes. The captured audio sources are generally referred to as "stems." It is sometimes acceptable to mix some direct stems in, using the described engine, with other signals recorded "live" in a location providing good spatial impression. This is, however, unusual in the cinema because of the problem in rendering such sounds well in cinema (large room). The use of substantially dry stems allows the engineer to add desired diffusion or reverberation effects in the form of metadata, while preserving the dry characteristic of the audio source tracks for use in the reverberant cinema (where some reverberation will come, without mixer control, from the cinema building itself).

A metadata production engine 108 receives audio signal input (derived from either live or recorded sources, representing sound) and processes said audio signal under control of mixing engineer 110. The engineer 110 also interacts with the metadata production engine 108 via an input device 109, interfaced with the metadata production engine 108. By user input, the engineer is able to direct the creation of metadata representative of artistic user-choices, in synchronous relationship with the audio signal. For example, the mixing engineer 110 selects, via input device 109, to match direct/diffuse audio characteristics (represented by metadata) to synchronized cinematic scene changes.

"Metadata" in this context should be understood to denote an abstracted, parameterized, or summary representation, as by a series of encoded or quantized parameters. For example, metadata includes a representation of reverberation parameters, from which a reverberator can be configured in receiver/decoder. Metadata may also include other data such as mixing coefficients and inter-channel delay parameters. The metadata generated by the production engine 108 will be time varying in increments or temporal "frames" with the frame metadata pertaining to specific time intervals of corresponding audio data.

A time-varying stream of audio data is encoded or compressed by a multichannel encoding apparatus 112, to produce encoded audio data in a synchronous relationship with the corresponding metadata pertaining to the same times. Both the metadata and the encoded audio signal data are preferably multiplexed into a combined data format by multi channel multiplexer 114. Any known method of multi-channel audio compression could be employed for encoding the audio data; but in a particular embodiment the encoding methods described in U.S. Pat. Nos. 5,974,380; 5,978,762; and 6,487,535 (DTS 5.1 audio) are preferred. Other extensions and improvements, such as lossless or scalable encoding, could also be employed to encode the audio data. The multiplexer should preserve the synchronous relationship between metadata and corresponding audio data, either by framing syntax or by addition of some other synchronizing data.

The production engine 108 differs from the aforementioned prior encoder in that production engine 108 produces, based on user input, a time-varying stream of encoded metadata representative of a dynamic audio environment. The method to perform this is described more particularly below in connection with FIG. 14. Preferably, the metadata so produced is multiplexed or packed into a combined bit format or "frame" and inserted in a pre-defined "ancillary data" field of a data frame, allowing backward compatibility. Alternatively the metadata could be transmitted separately with some means to synchronize with the primary audio data transport stream.

In order to permit monitoring during the production process, the production engine 108 is interfaced with a monitoring decoder 116, which demultiplexes and decodes the combined audio stream and metadata to reproduce a monitoring signal at speakers 120. The monitoring speakers 120 should preferably be arranged in a standardized known arrangement (such as ITU-R BS775 (1993) for a five channel system). The use of a standardized or consistent arrangement facilitates mixing; and the playback can be customized to the actual listening environment based on comparison between the actual environment and the standardized or known monitoring environment. The monitoring system (116 and 120) allows the engineer to perceive the effect of the metadata and encoded audio, as it will be perceived by a listener (described below in connection with the receiver/decoder). Based on the auditory feedback, the engineer is able to make a more accurate choice to reproduce a desired psychoacoustic effect. Furthermore, the mixing artist will be able to switch between the "cinema" and "home theatre" settings, and thus be able to control both simultaneously.

The monitoring decoder 116 is substantially identical to the receiver/decoder, described more specifically below in connection with FIG. 2.

After encoding, the audio data stream is transmitted through a communication channel 130, or (equivalently) recorded on some medium (for example, optical disk such as a DVD or "Blu-ray" disk). It should be understood that for purposes of this disclosure, recording may be considered a special case of transmission. It should also be understood that the data may be further encoded in various layers for transmission or recording, for example by addition of cyclic redundancy checks (CRC) or other error correction, by addition of further formatting and synchronization information, physical channel encoding, etc. These conventional aspects of transmission do not interfere with the operation of the invention.

Referring next to FIG. 2, after transmission the audio data and metadata (together the "bitstream") are received and the metadata is separated in demultiplexer 232 (for example, by simple demultiplexing or unpacking of data frame having predetermined format). The encoded audio data is decoded by an audio decoder 236 by a means complementary to that employed by audio encoder 112, and sent to a data input of environment engine 240. The metadata is unpacked by a metadata decoder/unpacker 238 and sent to a control input of an environment engine 240. Environment engine 240 receives, conditions and remixes the audio data in a manner controlled by received metadata, which is received and updated from time to time in a dynamic, time varying manner. The modified or "rendered" audio signals are then output from the environmental engine, and (directly or ultimately) reproduced by speakers 244 in a listening environment 246.

It should be understood that multiple channels can be jointly or individually controlled in this system, depending on the artistic effect desired.

A more detailed description of the system of the invention is next given, more specifically describing the structure and functions of the components or submodules which have been referred to above in the more generalized, system-level terms. The components or submodules of the encoder aspect are described first, followed by those of the receiver/decoder aspect.

Metadata Production Engine:

According to the encoding aspect of the invention, digital audio data is manipulated by a metadata production engine 108 prior to transmission or storage.

The metadata production engine 108 may be implemented as a dedicated workstation or on a general purpose computer, programmed to process audio and metadata in accordance with the invention.

The metadata production engine 108 of the invention encodes sufficient metadata to control later synthesis of diffuse and direct sound (in a controlled mix); to further control the reverberation time of individual stems or mixes; to further control the density of simulated acoustic reflections to be synthesized; to further control count, lengths and gains of feedback comb filters and the count, lengths and gains of allpass filters in the environment engine (described below), to further control the perceived direction and distance of signals. It is contemplated that a relatively small data space (for example a few kilobits per second) will be used for the encoded metadata.

In a preferred embodiment, the metadata further includes mixing coefficients and a set of delays sufficient to characterize and control the mapping from N input to M output channels, where N and M need not be equal and either may be larger.

TABLE 1

| Field | Description |
|---|---|
| a1 | Direct rendering flag |
| X | Excitation codes (for standardized reverb sets) |
| T60 | Reverberation decay-time parameter |
| F1-Fn | "diffuseness" parameter discussed below in connection with diffusion and mixing engines. |
| a3-an | Reverberation density parameters |
| B1-bn | Reverberation setup parameters |
| C1-cn | Source position parameters |
| D1-dn | Source distance parameters |
| L1-ln | Delay parameters |
| G1-gn | Mixing coefficients (gain values) |

Table 1 shows exemplary metadata which is generated in accordance with the invention. Field a1 denotes a "direct rendering" flag: this is a code that specifies for each channel an option for the channel to be reproduced without the introduction of synthetic diffusion (for example, a channel recorded with intrinsic reverberation). This flag is user controlled by the mixing engineer to specify a track that the mixing engineer does not choose to be processed with diffusion effects at the receiver. For example, in a practical mixing situation, an engineer may encounter channels (tracks or "stems") that were not recorded "dry" (in the absence of reverberation or diffusion). For such stems, it is necessary to flag this fact so that the environment engine can render such channels without introducing additional diffusion or reverberation. In accordance with the invention, any input channel (stem), whether direct or diffuse, may be tagged for direct reproduction. This feature greatly increases the flexibility of the system. The system of the invention thus allows for the separation between direct and diffuse input channels (and the independent separation of direct from diffuse output channels, discussed below).

The field designated "X" is a reserved for excitation codes associated with previously developed standardized reverb sets. The corresponding standardized reverb sets are stored at the decoder/playback equipment and can be retrieved by lookup from memory, as discussed below in connection with the diffusion engine.

Field "T60" denotes or symbolizes a reverberation decay parameter. In the art, the symbol "T60" is often used to refer to the time required for the reverberant volume in an environment to fall to 60 decibels below the volume of the direct sound. This symbol is accordingly used in this specification, but it should be understood that other metrics of reverberation decay time could be substituted. Preferably the parameter should be related to the decay time constant (as in the exponent of a decaying exponential function), so that decay can be synthesized readily in a form similar to:

$$\mathrm{Exp}(-kt) \qquad \text{(Eq. 1)}$$

where k is a decay time constant. More than one T60 parameter may be transmitted, corresponding to multiple channels, multiple stems, or multiple output channels, or the perceived geometry of the synthetic listening space.

Parameters A3-An represent (for each respective channel) a density value or values, (for example, values corresponding to lengths of delays or number of samples of delays), which directly control how many simulated reflections the diffusion engine will apply to the audio channel. A smaller density value would produce a less-complex diffusion, as discussed in more detail below in connection with the diffusion engine. While "lower density" is generally inappropriate in musical settings, it is quite realistic when, for instance, movie characters are moving through a pipe, in a room with hard (metal, concrete, rock . . . ) walls, or other situations where the reverb should have a very "fluttery" character.

Parameters B1-Bn represent "reverb setup" values, which completely represent a configuration of the reverberation module in the environment engine (discussed below). In one embodiment, these values represent encoded count, lengths in stages, and gains for of one or more feedback comb filters; and the count, lengths, and gains of Schroeder allpass filters in the reverberation engine (discussed in detail below). In addition, or as an alternative to transmitting parameters, the environment engine can have a database of pre-selected reverb values organized by profiles. In such case, the production engine transmits metadata that symbolically represent or select profiles from the stored profiles. Stored profiles offer less flexibility but greater compression by economizing the symbolic codes for metadata.

In addition to metadata concerning reverberation, the production engine should generate and transmit further metadata to control a mixing engine at the decoder. Referring again to table 1, a further set of parameters preferably include: parameters indicative of position of a sound source (relative to a hypothetical listener and the intended synthetic “room” or “space”) or microphone position; a set of distance parameters D1-DN, used by the decoder to control the direct/diffuse mixture in the reproduced channels; a set of Delay values L1-LN, used to control timing of the arrival of the audio to different output channels from the decoder; and a set of gain values G1-Gn used by the decoder to control changes in amplitude of the audio in different output channels. Gain values may be specified separately for direct and diffuse channels of the audio mix, or specified overall for simple scenarios.

The mixing metadata specified above is conveniently expressed as a series of matrices, as will be appreciated in light of inputs and outputs of the overall system of the invention. The system of the invention, at the most general level, maps a plurality of N input channels to M output channels, where N and M need not be equal and where either may be larger. It will be easily seen that a matrix G of dimensions N by M is sufficient to specify the general, complete set of gain values to map from N input to M output channels. Similar N by M matrices can be used conveniently to completely specify the input-output delays and diffusion parameters. Alternatively, a system of codes can be used to represent concisely the more frequently used mixing matrices. The matrices can then be easily recovered at the decoder by reference to a stored codebook, in which each code is associated with a corresponding matrix.

FIG. 3 shows a generalized data format suitable for transmitting the audio data and metadata multiplexed in time domain. Specifically, this example format is an extension of a format disclosed in U.S. Pat. No. 5,974,380 assigned to DTS, Inc. An example data frame is shown generally at 300. Preferably, frame header data 302 is carried near the beginning of the data frame, followed by audio data formatted into a plurality of audio subframes 304, 306, 308 and 310, One or more flags in the header 302 or in the optional data field 312 can be used to indicate the presence and length of the metadata extension 314, which may advantageously be included at or near the end of the data frame. Other data formats could be used; it is preferred to preserve backward compatibility so that legacy material can be played on decoders in accordance with the invention. Older decoders are programmed to ignore metadata in extension fields.

In accordance with the invention, compressed audio and encoded metadata are multiplexed or otherwise synchronized, then recorded on a machine readable medium or transmitted through a communication channel to a receiver/decoder.

Using the Metadata Production Engine:

From the viewpoint of the user, the method of using the metadata production engine appears straightforward, and similar to known engineering practices. Preferably the metadata production engine displays a representation of a synthetic audio environment (“room”) on a graphic user interface (GUI). The GUI can be programmed to display symbolically the position, size, and diffusion of the various stems or sound sources, together with a listener position (for example, at the center) and some graphic representation of a room size and shape. Using a mouse or keyboard input device 109, and with reference to a graphic user interface (GUI), the mixing engineer selects from a recorded stem a time interval upon which to operate. For example, the engineer may select a time interval from a time index. The engineer then enters input to interactively vary the synthetic sound environment for the stem during the selected time interval. Based on said input, the metadata production engine calculates the appropriate metadata, formats it, and passes it from time to time to the multiplexer 114 to be combined with the corresponding audio data. Preferably, a set of standardized presets are selectable from the GUI, corresponding to frequently encountered acoustic environments. Parameters corresponding to the presets are then retrieved from a pre-stored look-up table, to generate the metadata. In addition to standardized presets, manual controls are preferably provided for the skilled engineer can use to generate customized acoustic simulations.

The user’s selection of a reverberation parameters is assisted by the use of a monitoring system, as described above in connection with FIG. 1. Thus, reverberation parameters can be chosen to create a desired effect, based the acoustic feedback from the monitoring system 116 and 120.

Receiver/Decoder:

According to a decoder aspect, the invention includes methods and apparatus for receiving, processing, conditioning and playback of digital audio signals. As discussed above, the decoder/playback equipment system includes a demultiplexer 232, audio decoder 236, metadata decoder/unpacker 238, environment engine 240, speakers or other output channels 244, a listening environment 246 and preferably also a playback environment engine.

Figure 4:
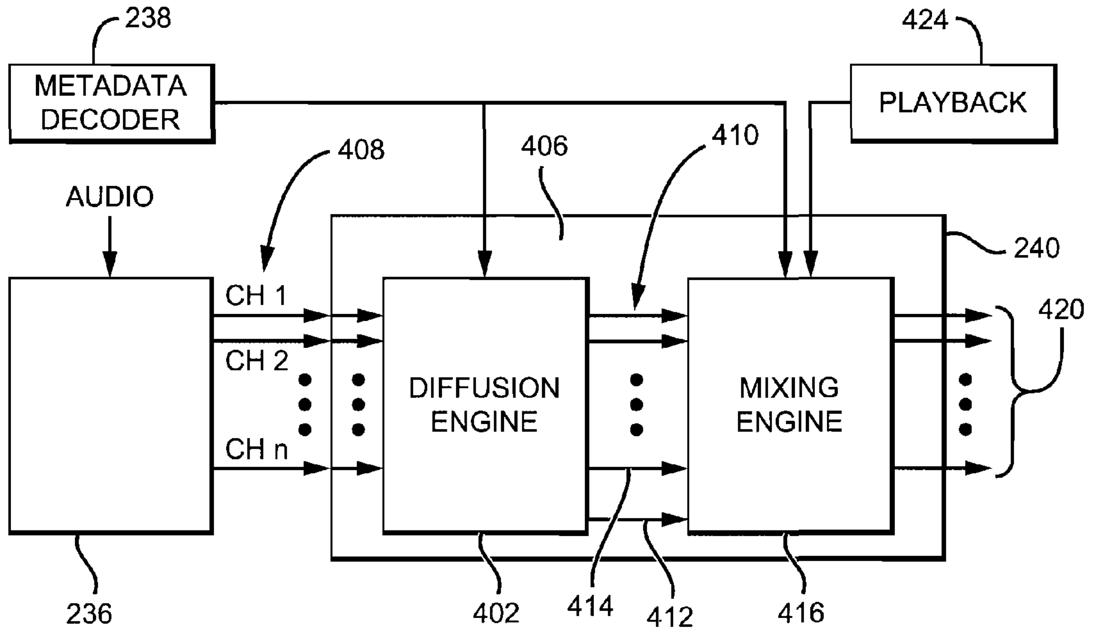
FIG. 4 is a schematic diagram of an audio diffusion processor used in the invention, with functional modules symbolically represented.

The functional blocks of the Decoder/Playback Equipment are shown in more detail in FIG. 4. Environment engine 240 includes a diffusion engine 402 in series with a mixing engine 404. Each are described in more detail below. It should be borne in mind that the environment engine 240 operates in a multi-dimensional manner, mapping N inputs to M outputs where N and M are integers (potentially unequal, where either may be the larger integer).

Metadata decoder/unpacker 238 receives as input encoded, transmitted or recorded data in a multiplexed format and separates for output into metadata and audio signal data. Audio signal data is routed to the decoder 236 (as input 236IN); metadata is separated into various fields and output to the control inputs of environment engine 240 as control data. Reverberation parameters are sent to the diffusion engine 402; mixing and delay parameters are sent to the mixing engine 416.

Decoder 236 receives encoded audio signal data and decodes it by a method and apparatus complementary to that used to encode the data. The decoded audio is organized into the appropriate channels and output to the environment engine 240. The output of decoder 236 is represented in any form that permits mixing and filtering operations. For example, linear PCM may suitably be used, with sufficient bit depth for the particular application.

Diffusion engine 402 receives from decoder 236 an N channel digital audio input, decoded into a form that permits mixing and filtering operations. It is presently preferred that the engine 402 in accordance with the invention operate in a time domain representation, which allows use of digital filters. According to the invention, Infinite Impulse Response (IIR) topology is strongly preferred because IIR has dispersion, which more accurately simulates real physical acoustical systems (low-pass plus phase dispersion characteristics).

Diffusion Engine:

The diffusion engine 402 receives the (N channel) signal input signals at signal inputs 408; decoded and demultiplexed metadata is received by control input 406. The engine 402 conditions input signals 408 in a manner controlled by and responsive to the metadata to add reverberation and delays, thereby producing direct and diffuse audio data (in multiple processed channels). In accordance with the invention, the diffusion engine produces intermediate processed channels 410, including at least one “diffuse” channel 412. The multiple processed channels 410, which include both direct channels 414 and diffuse channels 412, are then mixed in mixing engine 416 under control of mixing metadata received from metadata decoder/unpacker 238, to produce mixed digital audio outputs 420. Specifically, the mixed digital audio outputs 420 provide a plurality of M channels of mixed direct and diffuse audio, mixed under control of received metadata. In a particular novel embodiment the M channels of output may include one or more dedicated "diffuse" channels, suitable for reproduction through specialized "diffuse" speakers.

Figure 5:
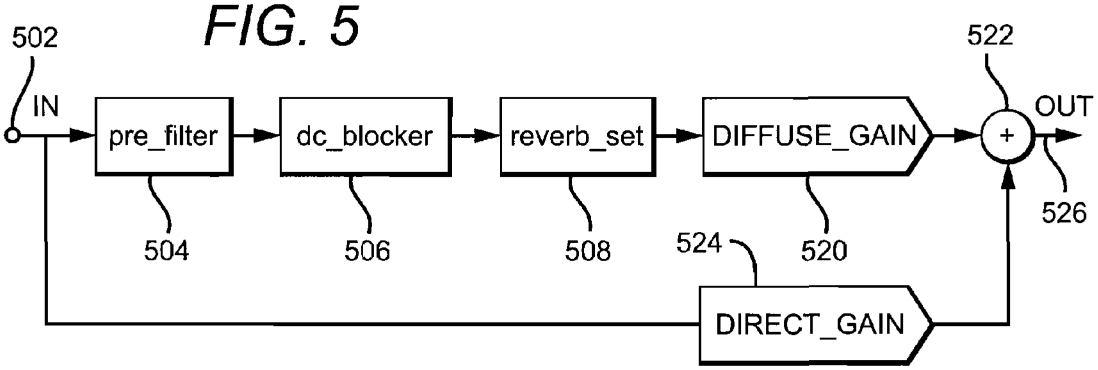
FIG. 5 is a schematic diagram of an embodiment of the diffusion engine of FIG. 4, with functional modules symbolically represented.

Referring now to FIG. 5, more details of an embodiment of the diffusion engine 402 can be seen. For clarity, only one audio channel is shown; it should be understood that in a multichannel audio system, a plurality of such channels will be used in parallel branches. Accordingly, the channel pathway of FIG. 5 would be replicated substantially N times for an N channel system (capable of processing N stems in parallel). The diffusion engine 402 can be described as a configurable, modified Schroeder-Moorer reverberator. Unlike conventional Schroeder-Moorer reverberators, the reverberator of the invention removes an FIR "early-reflections" step and adds an IIR filter in a feedback path. The IIR filter in the feedback path creates dispersion in the feedback as well as creating varying T60 as a function of frequency. This characteristic creates a perceptually diffuse effect.

Input audio channel data at input node 502 is prefiltered by prefilter 504 and D.C. components removed by D.C. blocking stage 506. Prefilter 504 is a 5-tap FIR lowpass filter, and it removes high-frequency energy that is not found in natural reverberation. DC blocking stage 506 is an IIR highpass filter that removes energy 15 Hertz and below. DC blocking stage 506 is necessary unless one can guarantee an input with no DC component. The output of DC blocking stage 506 is fed through a reverberation module ("reverb set" 508]. The output of each channel is scaled by multiplication by an appropriate "diffuse gain" in scaling module 520. The diffuse gain is calculated based upon direct/diffuse parameters received as metadata accompanying the input data (see table 1 and related discussion above). Each diffuse signal channel is then summed (at summation module 522) with a corresponding direct component (fed forward from input 502 and scaled by direct gain module 524) to produce an output channel 526.

Figure 5B:
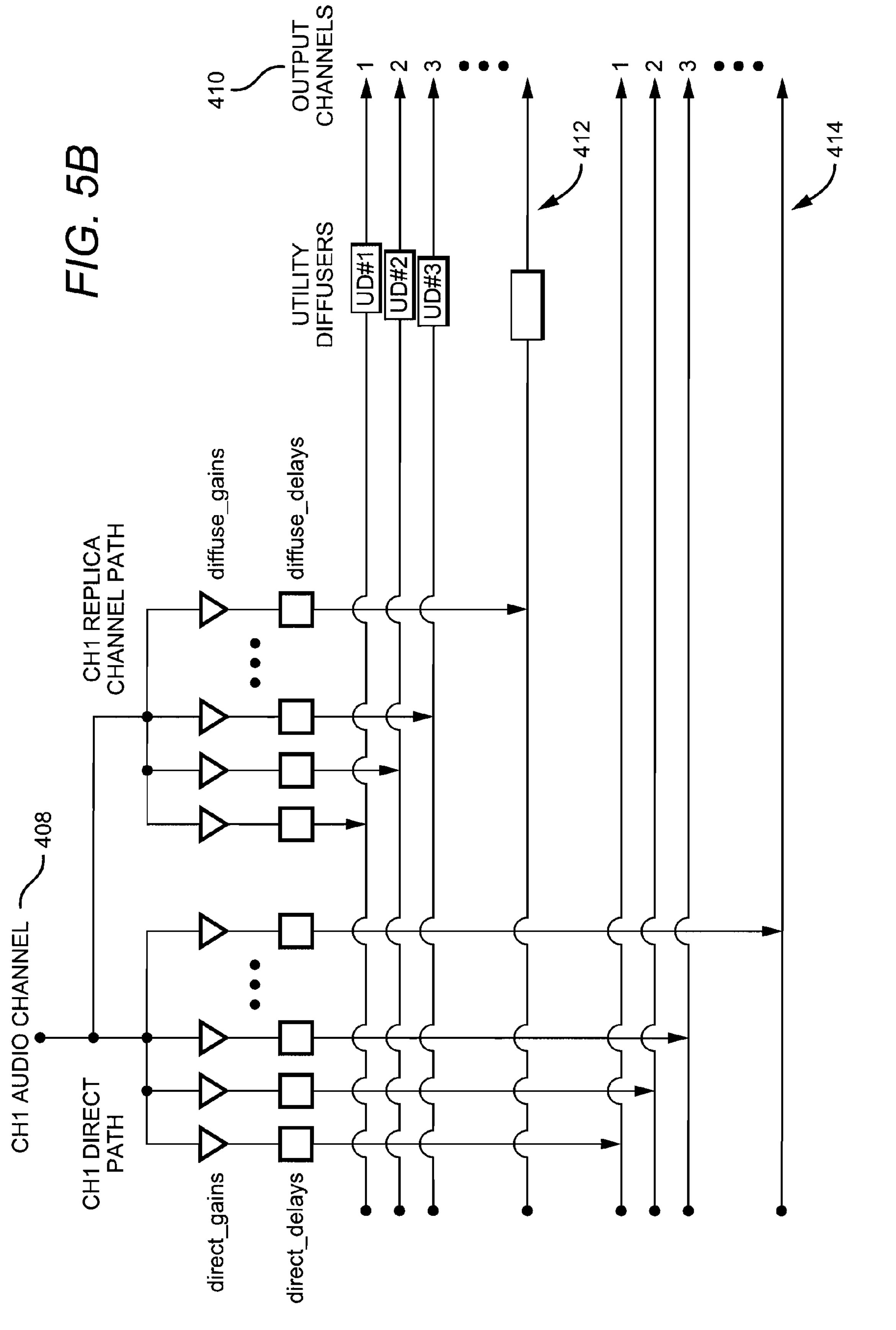
FIG. 5B is a schematic diagram of an alternative embodiment of the diffusion engine of FIG. 4, with functional modules symbolically represented.

In an alternative embodiment, the diffusion engine is configured such that the diffuse gains and delays and direct gains and delays are applied before the diffuse effect is applied. Referring now to FIG. 5*b*, more details of an alternative embodiment of the diffusion engine 402 can be seen. For clarity, only one audio channel is shown; it should be understood that in a multichannel audio system, a plurality of such channels will be used in parallel branches. Accordingly, the audio channel pathway of FIG. 5*b* would be replicated substantially N times for an N channel system (capable of processing N stems in parallel). The diffusion engine can be described as a configurable, utility diffuser which employs a specific diffuse effect and degree of diffuse and direct gains and delays per channel.

The audio input signal 408 is inputted into the diffuse engine and the appropriate direct gains and delays are applied accordingly per channel. Subsequently, the appropriate diffuse gains and delays are applied to the audio input signal per channel. Subsequently, the audio input signal 408 is processed by a bank of utility diffusers [UD1-UD3] (further described below) for applying a diffuse density or effect to the audio output signal per channel. The diffuse density or effect may be determinable by one or more metadata parameter.

For each audio channel 408 there is a different set of delay and gain contributions defined to each output channel. The contributions being defined as direct gains and delays and diffuse gains and delays.

Subsequently, the combined contributions from all audio input channels are processed by the bank of utility diffusers, such that a different diffuse effect is applied to each input channel. Specifically, the contributions define the direct and diffuse gain and delay of each input channel/output channel connection.

Once processed, the diffuse and direct signals 412, 414 are outputted to the mixing engine 416.

Reverberation Modules:

Each reverberation module comprises a reverb set (508-514). Each individual reverb set (of 508-514) is preferably implemented, in accordance with the invention, as shown in FIG. 6. Although multiple channels are processed substantially in parallel, only one channel is shown for clarity of explanation. Input audio channel data at input node 602 is processed by one or more Schroeder allpass filter 604 in series. Two such filters 604 and 606 are shown in series, as in a preferred embodiment two such are used. The filtered signal is then split into a plurality of parallel branches. Each branch is filtered by feedback comb filters 608 through 620 and the filtered outputs of the comb filters combined at summing node 622. The T60 metadata decoded by metadata decoder/unpacker 238 is used to calculate gains for the feedback comb filters 608-620. More details on the method of calculation are given below.

The lengths (stages, Z-n) of the feedback comb filters 608-620 and the numbers of sample delays in the Schroeder allpass filters 604 and 606 are preferably chosen from sets of prime numbers, for the following reason: to make the output diffuse, it is advantageous to ensure that the loops never coincide temporally (which would reinforce the signal at such coincident times). The use of prime number sample delay values eliminates such coincidence and reinforcement. In a preferred embodiment, seven sets of allpass delays and seven independent sets of comb delays are used, providing up to 49 decorrelated reverberators combinations derivable from the default parameters (stored at the decoder).

In a preferred embodiment, the allpass filters 604 and 606 use delays carefully chosen from prime numbers, specifically, in each audio channel 604 and 606 use delays such that the sum of the delays in 604 and 606 sum to 120 sample periods. (There are several pairs of primes available which sum to 120.) Different prime-pairs are preferably used in different audio signal channels, to produce diversity in ITD for the reproduced audio signal. Each of the feedback comb filters 608-620 uses a delay in the range 900 sample intervals and above, and most preferably in the range from 900-3000 sample periods. The use of so many different prime numbers results in a very complex characteristic of delay as a function of frequency, as described more fully below. The complex frequency vs. delay characteristic produces sounds which are perceptually diffuse, by producing sounds which, when reproduced, will have introduced frequency-dependent delays. Thus for the corresponding reproduced sound the leading edges of an audio waveform do not arrive at the same time in an ear at various frequencies, and the low frequencies do not arrive at the same time in an ear at at various frequencies.

Creating a Diffuse Sound Field

In a diffuse field it is impossible to discern a direction where the sound has come from.

Generally, a typical example of a diffuse sound field is the sound of reverberation in a room. The perception of diffusion can also be experienced in sound fields that are not reverberant (e.g. applause, rain, wind noise, or being surrounded by a swarm of buzzing insects).

A monophonic recording can capture the sensation of reverberation (i.e. the sensation that sound decay is prolonged in time). However, reproducing the sensation of diffusion of a reverberant sound field would require processing such a monophonic recording with utility diffusers or, more generally, employing a electroacoustic reproduction designed to impart diffusion on reproduced sound.

Diffuse sound reproduction in the home theatre can be accomplished in several ways. One way is to actually build a speaker or loudspeaker array that creates a diffuse sensation. When this is infeasible, it is also possible to create a soundbar-like apparatus that delivers a diffuse radiation pattern. Finally, when all of these are unavailable, and rendering via a standard multi-channel loudspeaker playback system is required, one can use utility diffusers in order to create interference between the direct paths that will disrupt the coherence of any one arrival to the extent that a diffuse sensation can be experienced.

A utility diffuser is an audio processing module intended to produce the sensation of spatial sound diffusion over loudspeakers or headphones. This can be achieved by using various audio processing algorithms which generally decorrelate or break up the coherence between loudspeaker channel signals.

One method of implementing utility diffusers includes employing algorithms originally designed for multi-channel artificial reverberation and configuring the same to output several uncorrelated/incoherent channels from a single input channel or from several correlated channels (as shown in FIG. 6 and accompanying text). Such algorithms may be modified to obtain utility diffusers that do not produce a noticeable reverberation effect.

A second method of implementing utility diffusers includes employing algorithms originally designed for simulating a spatially extended sound source (as opposed to a point source) from a monophonic audio signal. Such algorithms can be modified to simulate an enveloping sound (without creating a sense of reverberation).

A utility diffuser can be simply realized by employing a set of short-decay reverberators (T60=0.5 second or less), each applied to one of the loudspeaker output channels (as illustrated in FIG. 5*b*). In a preferred embodiment, such utility diffusers are designed to assure that the time delay in one module, as well as differential time delays between modules, varies in a complicated fashion over frequency, resulting in dispersion of the phase of the arrival at the listener at low frequencies, as well as modification of the signal envelope at high frequencies. Such a diffuser is not a typical reverberator, as it will have a T60 that is approximately constant across frequency, and will not be used, in and of itself, for an actual "reverberant" sound.

Figure 5C:
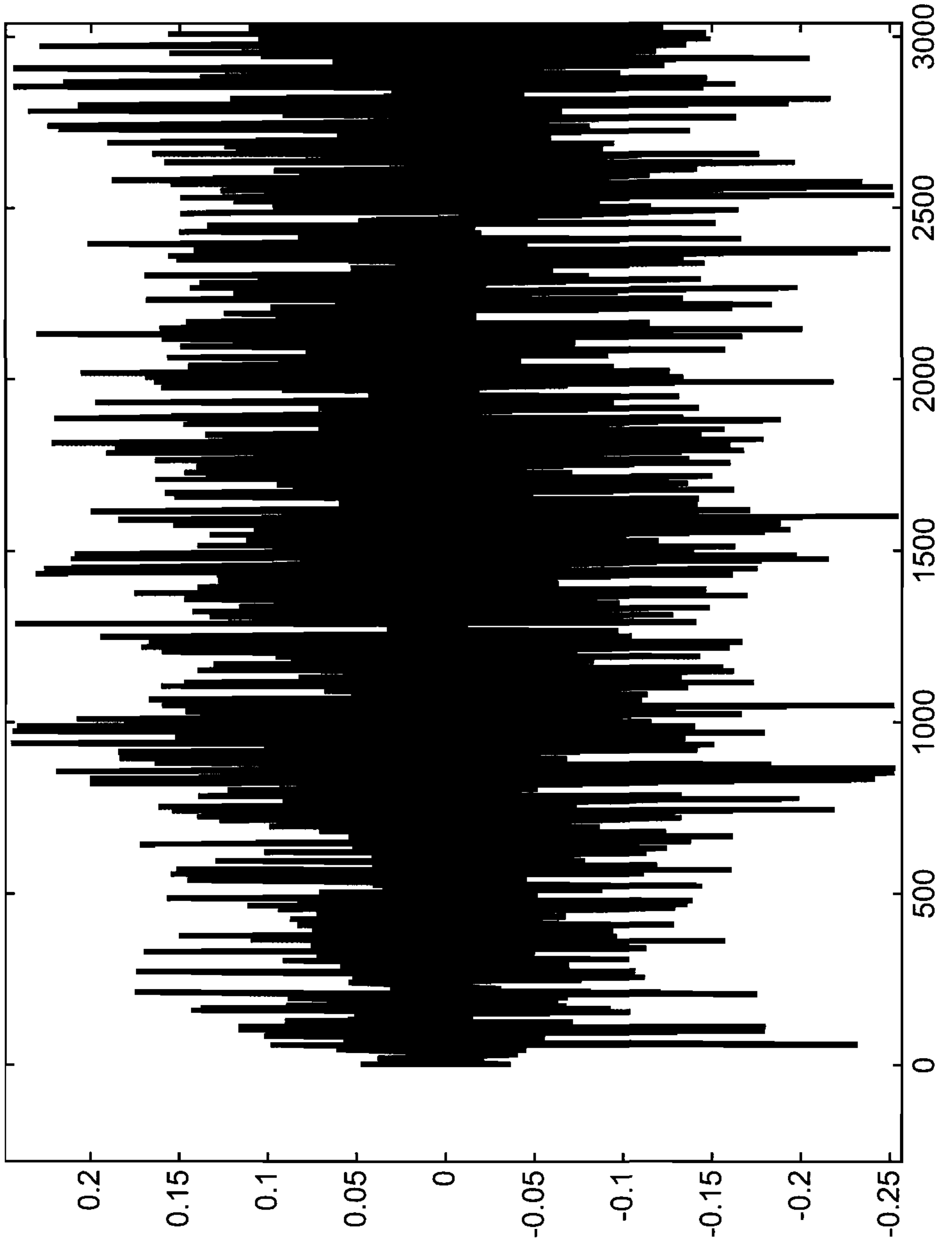
FIG. 5C is an exemplary sound wave plot of interaural phase difference (in radians) vs. frequency (up to 400 Hz) obtained at the listener's ears by a 5-channel utility diffuser in a conventional horizontal loudspeaker layout.

As an example, FIG. 5C plots the interaural phase difference created by such a utility diffuser. The vertical scale is radians, and the horizontal scale is a section of the frequency domain from 0 Hz to around 400 Hz. The horizontal scale is expanded so that detail is visible. Bear in mind that the measure is in radians, not in samples or time units. This plot clearly shows how interaural time difference is heavily confused. While time delay across frequency in one ear is not shown, it is similar in nature, but slightly less complex.

Alternative approaches for realizing utility diffusers include frequency-domain artificial reverberation as further described in Faller, C., "Parametric multichannel audio coding: synthesis of coherence cues," *IEEE Trans. on Audio,*

*Speech, and Language Processing*, Vol. 14, no. 1, January 2006; or the use of all-pass filters realized in the time domain or in the frequency domain as further described in Kendall, G., "The decorrelation of audio signals and its impact on spatial imagery," *Computer Music Journal, Vol.* 19, no. 4, Winter 1995, and Boueri, M. and Kyriakakis, C. "Audio signal decorrelation based on a critical band approach," 117$^{th}$ AES Convention, October 2004.

In a situation where the diffusion is specified from one or more dry channels, a more typical reverberation system is quite appropriate, as it is entirely possible to provide both the utility diffusion as well as the actual, perceptible reverberation, using the same engine as the utility diffuser, but with simple modifications that create a T60 vs. frequency profile desired by the content creator. A modified Schroeder-Moorer reverberator, such as shown in FIG. 6, can provide either strictly utility diffusion or audible reverberation, as desired by the content creator. When such a system is used, the delays used in each reverberator may advantageously be selected to be mutually prime. (This is easily accomplished by using sets of similar, but mutually prime numbers as sample delays in the feedback comb filters, and different pairs of primes adding up to the same total delay in the "Schroeder Sections", or 1-tap allpass filters.) Utility diffusion can also be accomplished with multi-channel recursive reverberation algorithms such as further described in Jot, J.-M. and Chaigne, A., "Digital delay networks for designing artificial reverberators," 90th AES Convention, February 1991.

Figure 7:
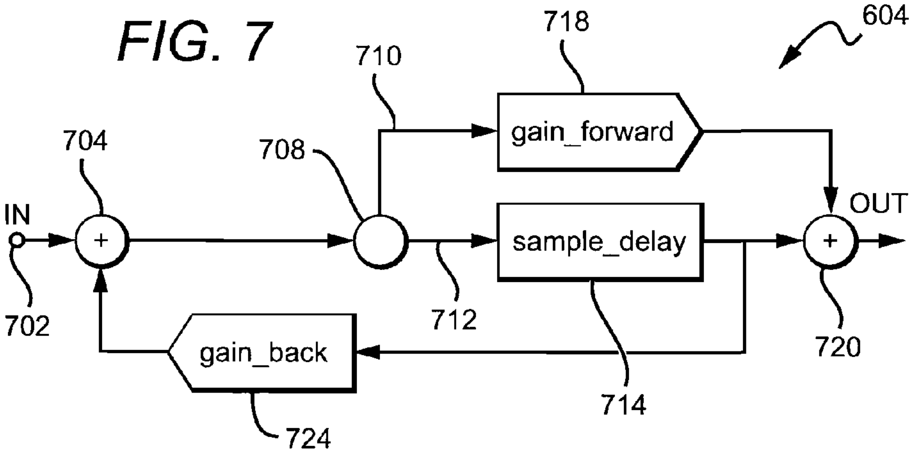
FIG. 7 is a schematic diagram of an allpass filter suitable for implementing a submodule of the reverberator module in FIG. 6, with functional modules symbolically represented.

Allpass Filters:

Referring now to FIG. 7, an allpass filter is shown, suitable for implementing either or both the Schroeder allpass filters 604 and 606 in FIG. 6. Input signal at input node 702 is summed with a feedback signal (described below) at summing node 704. The output from 704 branches at branch node 708 into a forward branch 710 and delay branch 712. In delay branch 712 the signal is delayed by a sample delay 714. As discussed above, in a preferred embodiment delays are preferably selected so that the delays of 604 and 606 sum to 120 sample periods. (The delay time is based on a 44.1 kHz sampling rate—other intervals could be selected to scale to other sampling rates while preserving the same psychoacoustic effects.) In the forward branch 712, the forward signal is summed with the multiplied delay at summing node 720, to produce a filtered output at 722. The delayed signal at branch node 708 is also multiplied in a feedback pathway by feedback gain module 724 to provide the feedback signal to input summing note 704 (previously described). In a typical filter design, gain forward and gain back will be set to the same value, except that one must have the opposite sign from the other.

Feedback Comb Filters:

FIG. 8 shows a suitable design usable for each of the feedback comb filters (608-620 in FIG. 6).

The input signal at 802 is summed in summing node 803 with a feedback signal (described below) and the sum is delayed by a sample delay module 804. The delayed output of 804 is output at node 806. In a feedback pathway the output at 806 is filtered by a filter 808 and multiplied by a feedback gain factor in gain module 810. In a preferred embodiment, this filter should be an IIR filter as discussed below. The output of gain module or amplifier 810 (at node 812) is used as the feedback signal and summed with input signal at 803, as previously described.

Certain variables are subject to control in the feedback comb filter in FIG. 8: a) the length of the sample delay 804; b) a gain parameter g such that $0<g<1$ (shown as gain 810 in the diagram); and c) coefficients for an IIR filter that can selectively attenuate different frequencies (filter 808 in FIG. 8). In the comb filters according to the invention, one or preferably more of these variables are controlled in response to decoded metadata (decoded in #). In a typical embodiment, the filter 808 should be a lowpass filter, because natural reverberation tends to emphasize lower frequencies. For example, air and many physical reflectors (e.g. walls, openings, etc) generally act as lowpass filters. In general, the filter 808 is suitably chosen (at the metadata engine 108 in FIG. 1) with a particular gain setting to emulate a T60 vs. frequency profile appropriate to a scene. In many cases, the default coefficients may be used. For less euphonic settings or special effects, the mixing engineer may specify other filter values. In addition, the mixing engineer can create a new filter to mimic the T60 performance of most any T60 profile via standard filter design techniques. These can be specified in terms of first or second order section sets of IIR coefficients.

Determination of Reverberator Variables:

One can define the reverb sets (508-514 in FIG. 5) in terms of the parameter "T60", which is received as metadata and decoded by metadata decoder/unpacker 238. The term "T60" is used in the art to indicate the time, in seconds, for the reverberation of a sound to decay by 60 decibels (dB). For example, in a concert hall, reverberant reflections might take as long as four seconds to decay by 60 dB; one can describe this hall as having a "T60 value of 4.0". As used herein, the reverberation decay parameter or T60 is used to denote a generalized measure of decay time for a generally exponential decay model. It is not necessarily limited to a measurement of the time to decay by 60 decibels; other decay times can be used to equivalently specify the decay characteristics of a sound, provided that the encoder and decoder use the parameter in a consistently complementary manner.

To control the "T60" of the reverberator, the metadata decoder calculates an appropriate set of feedback comb filter gain values, then outputs the gain values to the reverberator to set said filter gain values. The closer the gain value is to 1.0, the longer the reverberation will continue; with a gain equal to 1.0, the reverberation would never decrease, and with a gain exceeding 1.0, the reverberation would increase continuously (making a "feedback screech" sort of sound). In accordance with a particularly novel embodiment of the invention, Equation 2 is used to compute a gain value for each of the feedback comb filters:

$$\text{gain} = 10^{\left(\frac{-3\times sample\_delay}{T60\times fs}\right)} \quad \text{(eq. 2)}$$

where the sampling rate for the audio is given by "fs", and sample_delay is the time delay (expressed in number of samples at known sample rate fs) imposed by the particular comb filter. For example, if we have a feedback comb filter with sample_delay length of 1777, and we have input audio with a sampling rate of 44,100 samples per second, and we desire a T60 of 4.0 seconds, one can compute:

$$\text{gain} = 10^{\left(\frac{-3\times 1777}{4.0\times 44100}\right)} = 0.932779 \quad \text{(eq. 3)}$$

In a modification to the Schroeder-Moorer reverberator, the invention includes seven feedback comb filters in parallel as shown in FIG. 6 above, each one with a gain whose value was calculated as shown above, such that all seven have a consistent T60 decay time; yet, because of the mutually prime sample_delay lengths, the parallel comb filters, when summed, remain orthogonal, and thus mix to create a complex, diffuse sensation in the human auditory system.

To give the reverberator a consistent sound, one may suitably use the same filter 808 in each of the feedback comb filters. It is strongly preferred, in accordance with the invention, to use for this purpose an "infinite impulse response" (IIR) filter. The default IIR filter is designed to give a lowpass effect similar to the natural lowpass effect of air. Other default filters can provide other effects, such as "wood", "hard surface", and "extremely soft" reflection characteristics to change the T60 (whose maximum is that specified above) at different frequencies in order to create the sensation of very different environments.

In a particularly novel embodiment of the invention, the parameters of the IIR filter 808 are variable under control of received metadata. By varying the characteristics of the IIR filter, the invention achieves control of the "frequency T60 response", causing some frequencies of sound to decay faster than others. Note that a mixing engineer (using metadata engine 108) can dictate other parameters for apply filters 808 in order to create unusual effects when they are considered artistically appropriate, but that these are all handled inside the same IIR filter topology. The number of combs is also a parameter controlled by transmitted metadata. Thus, in acoustically challenging scenes the number of combs may be reduced to provide a more "tube-like" or "flutter echo" sound quality (under the control of the mixing engineer).

In a preferred embodiment, the number of Schroeder allpass filters is also variable under control of transmitted metadata: a given embodiment may have zero, one, two, or more. (Only two are shown in the figure, to preserve clarity.) They serve to introduce additional simulated reflections and to change the phase of the audio signal in unpredictable ways. In addition, the Schroeder sections can provide unusual sound effects in and of themselves when desired.

In a preferred embodiment of the invention, the use of received metadata (generated previously by metadata production engine 108 under user control) controls the sound of this reverberator by changing the number of Schroeder allpass filters, by changing the number of feedback comb filters, and by changing the parameters inside these filters. Increasing the number of comb filters and allpass filters will increase the density of reflections in the reverberation. A default value of 7 comb filters and 2 allpass filters per channel has been experimentally determined to provide a natural-sounding reverb that is suitable for simulating the reverberation inside a concert hall. When simulating a very simple reverberant environment, such as the inside of a sewer pipe, it is appropriate to reduce the number of comb filters. For this reason, the metadata field "density" is provided (as previously discussed) to specify how many of the comb filters should be used.

The complete set of settings for a reverberator defines the "reverb_set". A reverb_set, specifically, is defined by the number of allpass filters, the sample_delay value for each, and the gain values for each; together with the number of feedback comb filters, the sample_delay value for each, and a specified set of IIR filter coefficients to be used as the filter 808 inside each feedback comb filter.

In addition to unpacking custom reverb sets, in a preferred embodiment the metadata decoder/unpacker module 238 stores multiple pre-defined reverb sets with different values, but with average sample_delay values that are similar. The metadata decoder selects from the stored reverb sets in response to an excitation code received in the metadata field of the transmitted audio bitstream, as discussed above.

The combination of the allpass filters (604, 606) and the multiple, various comb filters (608-620) produces a very complex delay vs frequency characteristic in each channel; furthermore, the use of different delay sets in different channels produces an extremely complex relationship in which the delay varies a) for different frequencies within a channel, and b) among channels for the same or different frequencies. When output to a multi-channel speaker system ("surround sound system") this can (when directed by metadata) produce a situation with frequency-dependent delays so that the leading edges of an audio waveform (or envelope, for high frequencies) do not arrive at the same time in an ear at various frequencies. Furthermore, because the right ear and left ear receive sound preferentially from different speaker channels in a surround sound arrangement, the complex variations produced by the invention cause for the leading edge of the envelope (for high frequencies) or the low frequency waveform to arrive at the ears with varying inter-aural time delay for different frequencies. These conditions produce "perceptually diffuse" audio signals, and ultimately "perceptually diffuse" sounds when such signals are reproduced.

Figure 9:
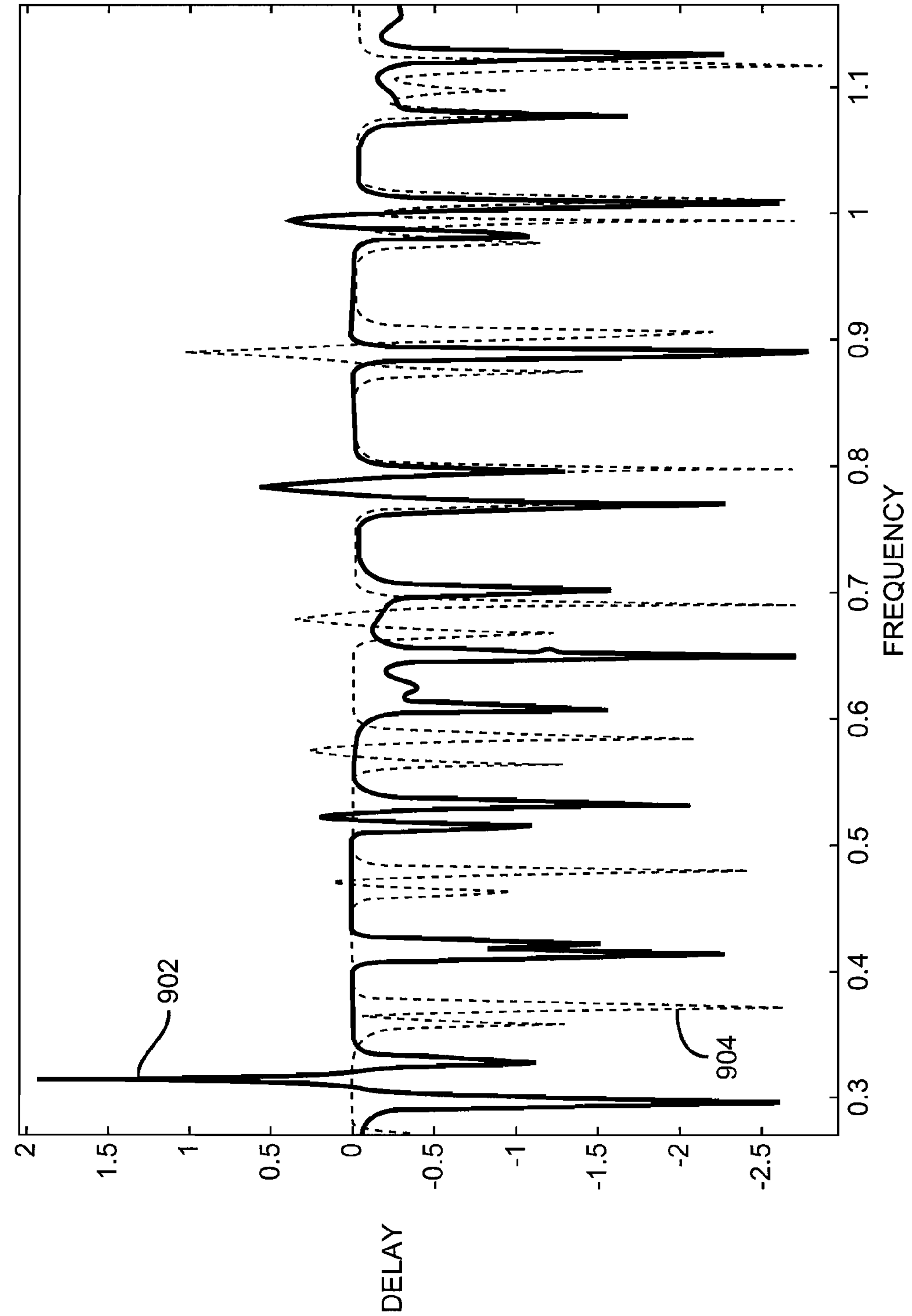
FIG. 9 is a graph of delay as a function of normalized frequency for a simplified example, comparing two reverberators of FIG. 5 (having different specific parameters)

FIG. 9 shows a simplified delay vs. frequency output characteristic from two different reverberator modules, programmed with different sets of delays for both allpass filters and reverb sets. Delay is given in sampling periods and frequency is normalized to the Nyquist frequency. A small portion of the audible spectrum is represented, and only two channels are shown. It can be seen that curve 902 and 904 vary in a complex manner across frequencies. The inventors have found that this variation produces convincing sensations of perceptual diffusion in a surround system (for example, extended to 7 channels).

As depicted in the (simplified) graph of FIG. 9, the methods and apparatus of the invention produces a complex and irregular relationship between delay and frequency, having a multiplicity of peaks, valleys, and inflections. Such a characteristic is desirable for a perceptually diffuse effect. Thus, in accordance with a preferred embodiment of the invention, the frequency dependent delays (whether within one channel or between channels) are of a complex and irregular nature—sufficiently complex and irregular to cause the psychoacoustic effect of diffusing a sound source. This should not be confused with simple and predictable phase vs. frequency variations such as those resulting from simple and conventional filters (such as low-pass, band-pass, shelving, etc.) The delay vs. frequency characteristics of the invention are produced by a multiplicity of poles distributed across the audible spectrum.

Simulating Distance by Mixing Direct and Diffuse Intermediate Signals:

In nature, if the ear is very distant from an audio source, only a diffuse sound can be heard. As the ear gets closer to the audio source, some direct and some diffuse can be heard. If the ear gets very close to the audio source, only the direct audio can be heard. A sound reproduction system can simulate distance from an audio source by varying the mix between direct and diffuse audio.

The environment engine only needs to "know" (receive) the metadata representing a desired direct/diffuse ratio to simulate distance. More accurately, in the receiver of the invention, received metadata represents the desired direct/diffuse ratio as a parameter called "diffuseness". This parameter is preferably previously set by a mixing engineer, as described above in connection with the production engine 108. If diffuseness is not specified, but use of the diffusion engine was specified, then a default diffuseness value may suitably be set to 0.5 (which represents the critical distance (the distance at which the listener hears equal amounts of direct and diffuse sound).

In one suitable parametric representation, the "diffuseness" parameter d is a metadata variable in a predefined range, such that $0 \le d \le 1$. By definition a diffuseness value of 0.0 will be completely direct, with absolutely no diffuse component; a diffuseness value of 1.0 will be completely diffuse, with no direct component; and in between, one may mix using a "diffuse_gain" and "direct_gain" values computed as:

$$G_{diffuse}=\sqrt{\text{diffuseness}}\,G_{direct}=\sqrt{1-\text{diffuseness}} \qquad \text{(Eq. 4)}$$

Accordingly, the invention mixes for each stem the diffuse and direct components based on a received "diffuseness" metadata parameter, in accordance with equation 3, in order to create a perceptual effect of a desired distance to a sound source.

Playback Environment Engine:

In a preferred and particularly novel embodiment of the invention, the mixing engine communicates with a "playback environment" engine (424 in FIG. 4) and receives from that module a set of parameters which approximately specify certain characteristics of the local playback environment. As noted above, the audio signals were previously recorded and encoded in a "dry" form (without significant ambience or reverberation). To optimally reproduce diffuse and direct audio in a specific local environment, the mixing engine responds to transmitted metadata and to a set of local parameters to improve the mix for local playback.

Playback environment engine 424 measures specific characteristics of the local playback environment, extracts a set of parameters and passes those parameters to a local playback rendering module. The playback environment engine 424 then calculates the modifications to the gain coefficient matrix and a set of M output compensating delays that should be applied to the audio signals and diffuse signals to produce output signals.

As shown in FIG. 10, The playback environment engine 424 extracts quantitative measurements of the local acoustic environment 1004. Among the variables estimated or extracted are: room dimensions, room volume, local reverberation time, number of speakers, speaker placement and geometry. Many methods could be used to measure or estimate the local environment. Among the most simple is to provide direct user input through a keypad or terminal-like device 1010. A microphone 1012 may also be used to provide signal feedback to the playback environment engine 424, allowing room measurements and calibration by known methods.

In a preferred, particularly novel embodiment of the invention, the playback environment module and the metadata decoding engine provide control inputs to the mixing engine. The mixing engine in response to those control inputs mixes controllably delayed audio channels including intermediate, synthetic diffuse channels, to produce output audio channels that are modified to fit the local playback environment.

Based on data from the playback environment module, the environment engine 240 will use the direction and distance data for each input, and the direction and distance data for each output, to determine how to mix the input to the outputs. Distance and direction of each input stem is included in received metadata (see table 1); distance and direction for outputs is provided by the playback environment engine, by measuring, assuming, or otherwise determining speaker positions in the listening environment.

Various rendering models could be used by the environment engine 240. One suitable implementation of the environment engine uses a simulated "virtual microphone array" as a rendering model as shown in FIG. 11. The simulation assumes a hypothetical cluster of microphones (shown generally at 1102) placed around the listening center 1104 of the playback environment, one microphone per output device, with each microphone aligned on a ray with the tail at the center of environment and the head directed toward a respective output device (speaker 1106); preferably the microphone pickups are assumed to be spaced equidistant from the center of environment.

The virtual microphone model is used to calculate matrices (dynamically varying) that will produce desired volume and delay at each of the hypothetical microphones, from each real speaker (positioned in the real playback environment). It will be apparent that the gain from any speaker to a particular microphone is sufficient to calculate, for each speaker of known position, the output volume required to realize a desired gain at the microphone. Similarly, knowledge of the speaker positions should be sufficient to define any necessary delays to match the signal arrival times to a model (by assuming a sound velocity in air). The purpose of the rendering model is thus to define a set of output channel gains and delays that will reproduce a desired set of microphone signals that would be produced by hypothetical microphones in the defined listening position. Preferably the same or an analogous listening position and virtual microphones is used in the production engine, discussed above, to define the desired mix.

In the "virtual microphone" rendering model, a set of coefficients Cn are used to model the directionality of the virtual microphones 1102. Using equations shown below, one can compute a gain for each input with respect to each virtual microphone. Some gains may evaluate very close to zero (an "ignorable" gain), in which case one can ignore that input for that virtual microphone. For each input-output dyad that has a non-ignorable gain, the rendering model instructs the mixing engine to mix from that input-output dyad using the calculated gain; if the gain is ignorable, no mixing need be performed for that dyad. (The mixing engine is given instructions in the form of "mixops" which will be fully discussed in the mixing engine section below. If the calculated gain is ignorable, the mixop may simply be omitted.) The microphone gain coefficients for the virtual microphones can be the same for all virtual microphones, or can be different. The coefficients can be provided by any convenient means. For example, the "playback environment" system may provide them by direct or analogous measurement. Alternatively, data could be entered by the user or previously stored. For standardized speaker configurations such as 5.1 and 7.1, the coefficients will be built-in based upon a standardized microphone/speaker setup.

The following equation may be used to calculate the gain of an audio source (stem) relative to a hypothetical "virtual" microphone in the virtual microphone rendering model:

$$gain_{sm} = \sum_j \sum_i c_{ij} \cdot \cos(i(\theta_s - \theta_m) + p_{ij}) \cdot \cos(j(\varphi_s - \varphi_m) + k_{ij}) \quad \text{(Eq. 5)}$$

The matrices $c_{ij}$, $p_{ij}$, and $k_{ij}$ are characterizing matrices representing the directional gain characteristics of a hypothetical microphone. These may be measured from a real microphone or assumed from a model. Simplified assumptions may be used to simplify the matrices. The subscript s identifies the audio stem; the subscript m identifies the virtual microphone. The variable theta (θ) represents the horizontal angle of the subscripted object (s for the audio stem, m for the virtual microphone). Phi (ϕ) is used to represent the vertical angle (of the corresponding subscript object).

The delay for a given stem with respect to a specific virtual microphone may be found from the equations:

$$x_m = \cos\theta_m \cos\phi_m \quad \text{(Eq. 6)}$$

$$y_m = \sin\theta_m \cdot \cos\phi_m \quad \text{(Eq. 7)}$$

$$z_m = \sin\phi_m \quad \text{(Eq. 8)}$$

$$x_s = \cos\theta_s \cdot \cos\phi_s \quad \text{(Eq. 9)}$$

$$y_s = \sin\theta_s \cdot \cos\phi_s \quad \text{(Eq. 10)}$$

$$z_s = \sin\phi_s \quad \text{(Eq. 11)}$$

$$t = x_m x_s + y_m y_s + z_m z_s \quad \text{(Eq. 12)}$$

$$\text{delay}_{sm} = \text{radius}_m \cdot t \quad \text{(Eq. 13)}$$

Where the virtual microphones are assumed to lie on a hypothetical annulus, and the $\text{radius}_m$ variable denotes the radius specified in milliseconds (for sound in the medium, presumably air at room temperature and pressure). With appropriate conversions, all angles and distances may be measured or calculated from different coordinate systems, based upon the actual or approximated speaker positions in the playback environment. For example, simple trigonometric relationships can be used to calculate the angles based on speaker positions expressed in Cartesian coordinates (x,y,z), as is known in the art.

A given, specific audio environment will provide specific parameters to specify how to configure the diffusion engine for the environment. Preferably these parameters will be measured or estimated by the playback environment engine 240, but alternatively may be input by the user or pre-programmed based on reasonable assumptions. If any of these parameters are omitted, default diffusion engine parameters may suitably be used. For example, if only T60 is specified, then all the other parameters should be set at their default values. If there are two or more input channels that need to have reverb applied by the diffusion engine, they will be mixed together and the result of that mix will be run through the diffusion engine. Then, the diffuse output of the diffusion engine can be treated as another available input to the mixing engine, and mixops can be generated that mix from the output of the diffusion engine. Note that the diffusion engine can support multiple channels, and both inputs and outputs can be directed to or taken from specific channels within the diffusion engine.

Mixing Engine:

The mixing engine 416 receives as control inputs a set of mixing coefficients and preferably also a set of delays from metadata decoder/unpacker 238. As signal inputs it receives intermediate signal channels 410 from diffusion engine 402. In accordance with the invention, the inputs include at least one intermediate diffuse channel 412. In a particularly novel embodiment, the mixing engine also receives input from playback environment engine 424, which can be used to modify the mix in accordance with the characteristics of the local playback environment.

As discussed above (in connection with the production engine 108) the mixing metadata specified above is conveniently expressed as a series of matrices, as will be appreciated in light of inputs and outputs of the overall system of the invention. The system of the invention, at the most general level, maps a plurality of N input channels to M output channels, where N and M need not be equal and where either may be larger. It will be easily seen that a matrix G of dimensions N by M is sufficient to specify the general, complete set of gain values to map from N input to M output channels. Similar N by M matrices can be used conveniently to completely specify the input-output delays and diffusion parameters. Alternatively, a system of codes can be used to represent concisely the more frequently used mixing matrices. The matrices can then be easily recovered at the decoder by reference to a stored codebook, in which each code is associated with a corresponding matrix.

Accordingly, to mix the N inputs into M outputs it is sufficient to multiply for each sample time a row (corresponding to the N inputs) times the ith column of the gain matrix (i=1 to M). Similar operations can be used to specify the delays to apply (N to M mapping) and the direct/diffuse mix for each N to M output channel mapping. Other methods of representation could be employed, including simpler scalar and vector representations (at some expense in terms of flexibility).

Unlike conventional mixers, the mixing engine in accordance with the invention includes at least one (and preferably more than one) input stems especially identified for perceptually diffuse processing; more specifically, the environment engine is configurable under control of metadata such that the mixing engine can receive as input a perceptually diffuse channel. The perceptually diffuse input channel may be either: a) one that has been generated by processing one or more audio channels with a perceptually relevant reverberator in accordance with the invention, or b) a stem recorded in a naturally reverberant acoustic environment and identified as such by corresponding metadata.

Figure 12:
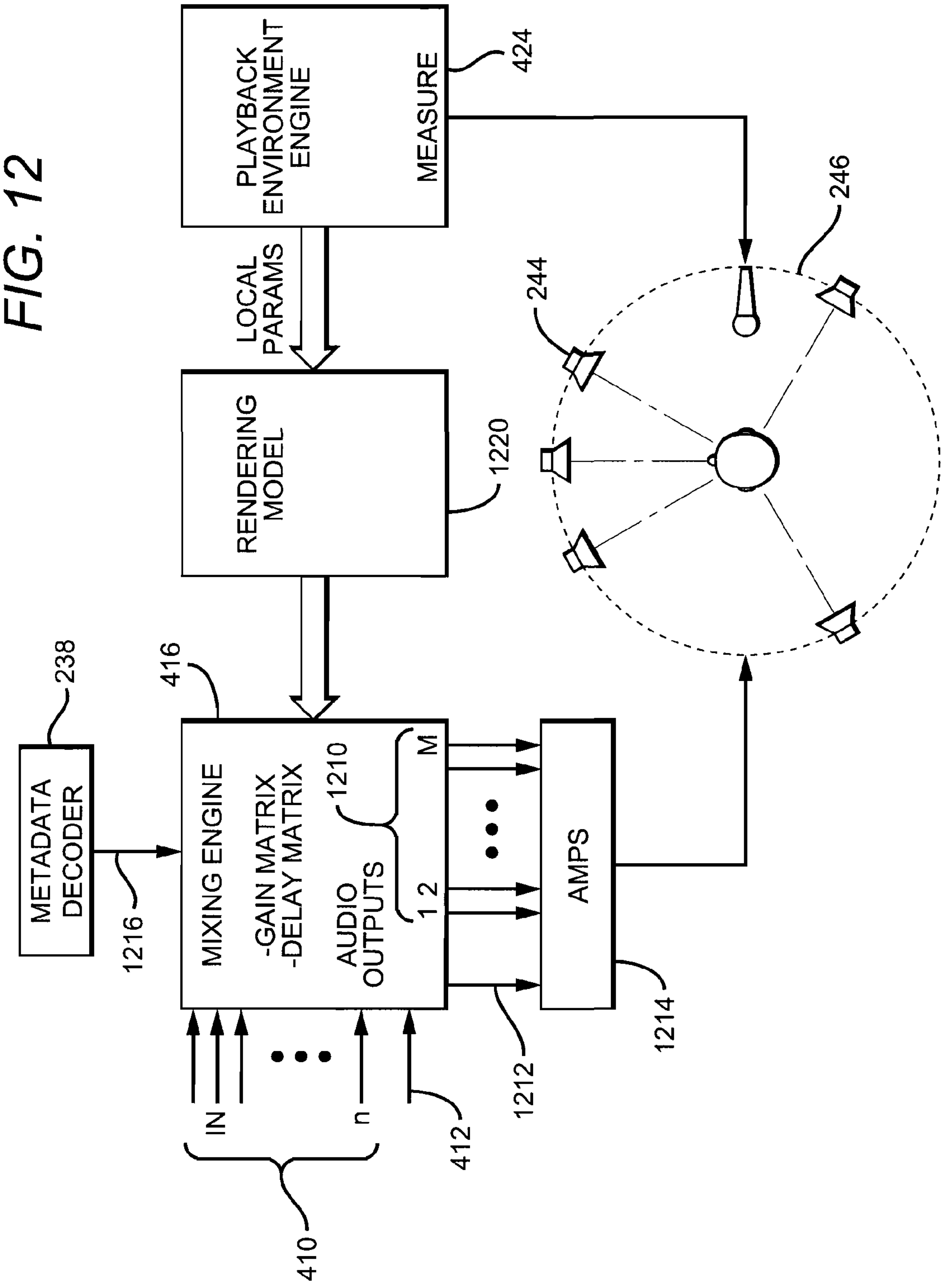
FIG. 12 is a schematic diagram of a mixing engine submodule of the environment engine of FIG. 4, with functional modules symbolically represented.

Accordingly, as shown in FIG. 12, the mixing engine 416 receives N' channels of audio input, which include intermediate audio signals 1202 (N channels) plus 1 or more diffuse channels 1204 generated by environment engine. The mixing engine 416 mixes the N' audio input channels 1202 and 1204, by multiplying and summing under control of a set of mixing control coefficients (decoded from received metadata) to produce a set of M output channels (1210 and 1212) for playback in a local environment. In one embodiment, a dedicated diffuse output 1212 is differentiated for reproduction through a dedicated, diffuse radiator speaker. The multiple audio channels are then converted to analog signals, amplified by amplifiers 1214. The amplified signals drive an array of speakers 244.

The specific mixing coefficients vary in time in response to metadata received from time to time by the metadata decoder/unpacker 238. The specific mix also varies, in a preferred embodiment, in response to information about the local playback environment. Local playback information is preferably provided by a playback environment module 424 as described above.

In a preferred, novel embodiment, the mixing engine also applies to each input-output pair a specified delay, decoded from received metadata, and preferably also dependent upon local characteristics of the playback environment. It is preferred that the received metadata include a delay matrix to be applied by the mixing engine to each input channel/output channel pair (which is then modified by the receiver based on local playback environment).

This operation can be described in other words by reference to a set of parameters denoted as "mixops" (for MIX OPeration instructions). Based on control data received from decoded metadata (via data path 1216), and further parameters received from the playback environment engine, the mixing engine calculates delay and gain coefficients (together "mixops") based on a rendering model of the playback environment (represented as module 1220).

The mix engine preferably will use "mixops" to specify the mixing to be performed. Suitably, for each particular input being mixed to each particular output, a respective single mixop (preferably including both gain and delay fields) will be generated. Thus, a single input can possibly generate a mixop for each output channel. To generalize, N×M mixops are sufficient to map from N input to M output channels. For example, a 7-channel input being played with 7 output channels could potentially generate as many as 49 gain mixops for direct channels alone; more are required in a 7 channel embodiment of the invention, to account for the diffuse channels received from the diffusion engine 402. Each mixop specifies an input channel, an output channel, a delay, and a gain. Optionally, a mixop can specify an output filter to be applied as well. In a preferred embodiment, the system allows certain channels to be identified (by metadata) as "direct rendering" channels. If such a channel also has a diffusion_flag set (in metadata) it will not be passed through the diffusion engine but will be input to a diffuse input of the mixing engine.

In a typical system, certain outputs may be treated separately as low frequency effects channels (LFE). Outputs tagged as LFE are treated specially, by methods which are not the subject of this invention. LFE signals could be treated in a separate dedicated channel (by bypassing diffusion engine and mixing engine).

An advantage of the invention lies in the separation of direct and diffuse audio at the point of encoding, followed by synthesis of diffuse effects at the point of decoding and playback. This partitioning of direct audio from room effects allows more effective playback in a variety of playback environments, especially where the playback environment is not a priori known to the mixing engineer. For example, if the playback environment is a small, acoustically dry studio, diffusion effects can be added to simulate a large theater when a scene demands it.

This advantage of the invention is well illustrated by a specific example: in a well known, popular film about Mozart, an opera scene is set in a Vienna opera house. If such a scene were transmitted by the method of the invention, the music would be recorded "dry" or as a more-or-less direct set of sounds (in multiple channels). Metadata could then be added by the mixing engineer at metadata engine 108 to demand synthetic diffusion upon playback. In response, at the decoder appropriate synthetic reverberation would be added if the playback theater is a small room such as a home living room. On the other hand, if the playback theater is a large auditorium, based on the local playback environment the metadata decoder would direct that less synthetic reverberation would be added (to avoid excessive reverberation and a resulting muddy effect).

Conventional audio transmission schemes do not permit the equivalent adjustment to local playback, because the room impulse response of a real room cannot be realistically (in practice) removed by deconvolution. Although some systems do attempt to compensate for local frequency response, such systems do not truly remove reverberation and cannot as a practical matter remove reverberation present in the transmitted audio signal. In contrast, the invention transmits direct audio in coordinated combination with metadata that facilitates synthesis or appropriate diffuse effects at playback, in a variety of playback environments.

Direct and Diffuse Outputs and Speakers:

In a preferred embodiment of the invention, the audio outputs (243 in FIG. 2) include a plurality of audio channels, which may differ in number from the number of audio input channels (stems). In a preferred, particularly novel embodiment of the decoder of the invention, dedicated diffuse outputs should preferentially be routed to appropriate speakers specialized for reproduction of diffuse sound. A combination direct/diffuse speaker having separate direct and diffuse input channels could be advantageously employed, such as the system described in U.S. patent application Ser. No. 11/847, 096 published as US2009/0060236A1. Alternatively, by using the reverberation methods described above, a diffuse sensation can be created by the interaction of the 5 or 7 channels of direct audio rendering via deliberate interchannel interference in the listening room created by the use of the reverb/diffusion system specified above.

Particular Embodiment of the Method of the Invention:

In a more particular, practical embodiment of the invention, the environment engine 240, metadata decoder/unpacker 238, and even the audio decoder 236 may be implemented on one or more general purpose microprocessors, or by general purpose microprocessors in concert with specialized, programmable integrated DSP systems. Such systems are most often described from procedural perspective. Viewed from a procedural perspective, it will be easily recognized that the modules and signal pathways shown in FIGS. 1-12 correspond to procedures executed by a microprocessor under control of software modules, specifically, under control of software modules including the instructions required to execute all of the audio processing functions described herein. For example, feedback comb filters are easily realized by a programmable microprocessor in combination with sufficient random access memory to store intermediate results, as is known in the art. All of the modules, engines, and components described herein (other than the mixing engineer) may be similarly realized by a specially programmed computer. Various data representations may be used, including either floating point of fixed point arithmetic.

Figure 13:
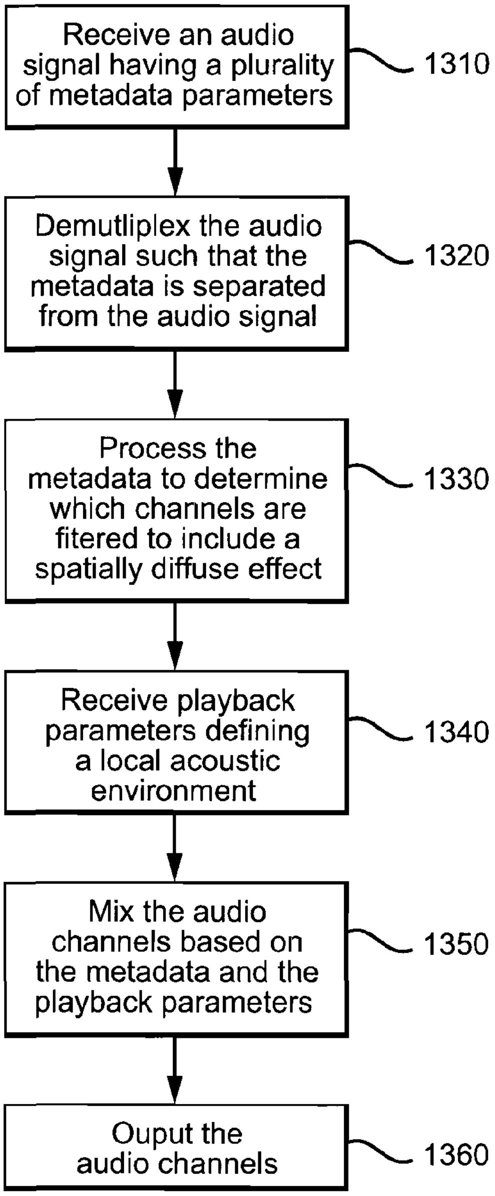
FIG. 13 is a procedural flow diagram of a method in accordance with the encoder aspect of the invention.

Now referring to FIG. 13, a procedural view of the receiving and decoding method is shown, at a general level. The method begins at step 1310 by receiving an audio signal having a plurality of metadata parameters. At step 1320, the audio signal is demultiplexed such that the encoded metadata is unpacked from the audio signal and the audio signal is separated into prescribed audio channels. The metadata includes a plurality of rendering parameters, mixing coefficients, and a set of delays, all of which are further defined in Table 1 above. Table 1 provides exemplary metadata parameters and is not intended to limit the scope of the present invention. A person skilled in the art will understand that other metadata parameters defining diffusion of an audio signal characteristic may be carried in the bitstream in accordance with the present invention.

The method continues at step 1330 by processing the metadata parameters to determine which audio channels (of the multiple audio channels) are filtered to include the spatially diffuse effect. The appropriate audio channels are processed by a reverb set to include the intended spatially diffuse effect. The reverb set is discussed in the section Reverberation Modules above. The method continues at step 1340 by receiving playback parameters defining a local acoustic environment. Each local acoustic environment is unique and each environment may impact the spatially diffuse effect of the audio signal differently. Taking into account characteristics of the local acoustic environment and compensating for any spatially diffuse deviations that may naturally occur when the audio signal is played in that environment promotes playback of the audio signal as intended by the encoder.

The method continues at step 1350 by mixing the filtered audio channels based on the metadata parameters and the playback parameters. It should be understood that generalized mixing includes mixing to each of N outputs weighted contributions from all of the M inputs, where N and M are the number of outputs and inputs, respectively. The mixing operation is suitably controlled by a set of "mixops" as described above. Preferably, a set of delays (based on received metadata) is also introduced as part of the mixing step (also as described above). At step 1360, the audio channels are output for playback over one or more loudspeakers.

Figure 14:
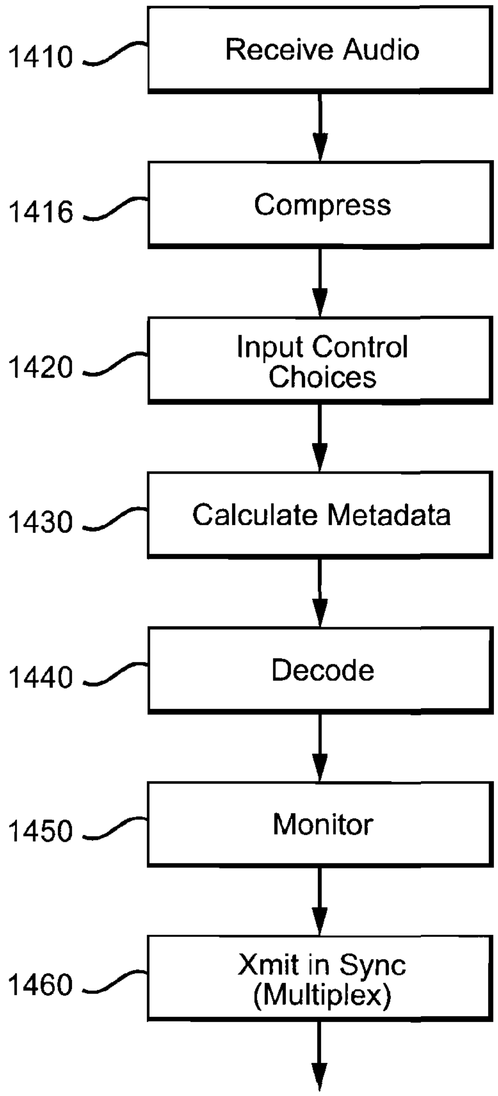
FIG. 14 is a procedural flow diagram of a method in accordance with the decoder aspect of the invention.

Referring next to FIG. 14, the encoding method aspect of the invention is shown at a general level. A digital audio signal is received in step 1410 (which may originate from live sounds captured, from transmitted digital signals, or from playback of recorded files). The signal is compressed or encoded (step 1416). In synchronous relationship with the audio, a mixing engineer ("user") inputs control choices into an input device (step 1420). The input determines or selects the desired diffusion effects and multichannel mix. An encoding engine produces or calculates metadata appropriate to the desired effect and mix (step 1430). The audio is decoded and processed by a receiver/decoder in accordance with the decode method of the invention (described above, step 1440). The decoded audio includes the selected diffusion and mix effects. The decoded audio is played back to the mixing engineer by a monitoring system so that he/she can verify the desired diffusion and mix effects (monitoring step 1450). If the source audio is from pre-recorded sources, the engineer would have the option to reiterate this process until the desired effect is achieved. Finally, the compressed audio is transmitted in synchronous relationship with the metadata representing diffusion and (preferably) mix characteristics (step 11460). This step in preferred embodiment will include multiplexing the metadata with compressed (multichannel) audio stream, in a combined data format for transmission or recording on a machine readable medium.

In another aspect, the invention includes a machine readable recordable medium recorded with a signal encoded by the method described above. In a system aspect, the invention also includes the combined system of encoding, transmitting (or recording), and receiving/decoding in accordance with the methods and apparatus described above.

It will be apparent that variations of processor architecture could be employed. For example: several processors can be used in parallel or series configurations. Dedicated "DSP" (digital signal processors) or digital filter devices can be employed as filters. Multiple channels of audio can be processed together, either by multiplexing signals or by running parallel processors. Inputs and outputs could be formatted in various manners, including parallel, serial, interleaved, or encoded.

While several illustrative embodiments of the invention have been shown and described, numerous other variations and alternate embodiments will occur to those skilled in the art. Such variations and alternate embodiments are contemplated, and can be made without departing from the spirit and scope of the invention as defined in the appended claims.

We claim:

1. A method for conditioning an encoded digital audio signal, said audio signal representative of a sound, comprising the steps:

receiving a digital audio signal comprising a plurality of source channels for outputting a plurality of output channels;

receiving encoded metadata associated with the digital audio signal, the metadata including at least one diffusion parameter indicating a desired rendering of at least one source channel with a diffuse effect;

decorrelating, by a utility diffuser, a contribution of the at least one source channel in at least two output channels with the diffuse effect based on the diffusion parameter; and generating the plurality of output channels.

2. The method of claim 1, wherein the utility diffuser includes at least one short decay reverberator.

3. The method of claim 2, wherein said short decay reverberator is configured such that a measure of decay over time (T60) is equal to 0.5 seconds or less.

4. The method of claim 3, wherein said short decay reverberator is configured such that the T60 is substantially constant across frequencies.

5. The method of claim 1, wherein the utility diffuser comprises a frequency-domain artificial reverberation filter.

6. The method of claim 1, further comprising filtering each output channel with an all-pass filter in time or frequency domains.

7. The method of claim 1, further comprising:

decoding received metadata for a second parameter that represents a desired diffuse density; and applying to the combined contributions in each output channel the desired diffuse density represented by the second parameter.

8. The method of claim 1, further comprising:

combining, for each of the plurality of output channels, contributions from each of at least two source channels to be rendered with the diffuse effect; and decorrelating, by the utility diffuser, the combined contributions in each output channel with the diffuse effect based on the diffusion parameter.

* * * * *